United States Patent
Yamada et al.

[11] Patent Number: 6,072,450
[45] Date of Patent: Jun. 6, 2000

[54] DISPLAY APPARATUS

[75] Inventors: Hiroyasu Yamada, Hachioji; Tomoyuki Shirasaki, Higashiyamato; Yoshihiro Kawamura, Fussa, all of Japan

[73] Assignee: Casio Computer Co., Ltd., Tokyo, Japan

[21] Appl. No.: 08/976,217

[22] Filed: Nov. 21, 1997

[30] Foreign Application Priority Data

Nov. 28, 1996 [JP] Japan .................................. 8-331388
Nov. 28, 1996 [JP] Japan .................................. 8-331389

[51] Int. Cl.[7] .................................................. H01L 27/12
[52] U.S. Cl. ........................... 345/76; 345/36; 345/45; 313/500; 313/504; 315/169.3
[58] Field of Search .................. 345/36, 45, 76; 313/498–512; 315/169.3

[56] References Cited

U.S. PATENT DOCUMENTS

| 5,302,468 | 4/1994 | Nimike et al. ............................ 313/500 |
| 5,302,966 | 4/1994 | Stewart .................................. 315/169.3 |
| 5,427,858 | 6/1995 | Nakamura et al. ...................... 428/421 |
| 5,640,067 | 6/1997 | Yamauchi et al. ...................... 313/504 |
| 5,684,365 | 11/1997 | Tang et al. ................................ 345/76 |
| 5,828,181 | 10/1998 | Okuda ....................................... 345/76 |
| 5,847,516 | 12/1998 | Kishita et al. ........................ 315/169.3 |
| 5,909,081 | 6/1999 | Eida et al. ............................... 313/504 |

*Primary Examiner*—Bipin Shalwala
*Assistant Examiner*—Vincent E. Kovalick
*Attorney, Agent, or Firm*—Frishauf, Holtz, Goodman, Langer & Chick, P.C.

[57] ABSTRACT

Selection transistors and drive transistors are formed in individual pixel areas on a substrate. Cathode electrodes which reflect visible light are formed above the selection transistors and the drive transistors so as to cover the pixel areas, with flat insulation films between the cathode electrodes and the selection and drive transistors. An organic EL layer and an anode electrode are sequentially formed on the cathode electrodes.

18 Claims, 21 Drawing Sheets

DISPLAY APPARATUS

BACKGROUND OF THE INVENTION

1. Field of the Invention

The present invention relates to a display apparatus, and more particularly to an electroluminescent (hereinafter referred to as EL) display apparatus with a matrix display panel including EL elements.

2. Description of the Related Art

An EL display apparatus with organic EL elements, that is, display elements which emit light spontaneously and which are arranged in a matrix pattern, is known conventionally. A passive matrix type EL display apparatus is available as such an EL display apparatus. In this type of EL display apparatus, parallel cathode lines serve as common lines, while parallel anode lines which are perpendicular to the cathode lines and which are made of ITO (indium tin oxide) serve as data lines. An organic EL layer is arranged between the set of the cathode lines and the set of the anode lines. A positive voltage is applied to the data lines in each of cathode selection periods, thereby driving organic EL elements located at the intersections of the common lines and the data lines. The display apparatus displays an image which corresponds to the voltage applied to the data lines. In the case of the passive matrix type EL display apparatus which displays an image by driving such organic EL elements, the larger the number of common lines and/or the number of data lines, the shorter the selection period (duty H) per pixel. The period of time over which the organic EL layer keeps emitting light even after the application of a voltage between the set of the cathode lines and the set of the anode lines is short. In consideration of this, according to the conventional passive matrix type EL display apparatus, the instantaneous luminance of the organic EL layer of each pixel during the selection periods is intensified so that the organic EL layer apparently emits light over 1 frame period. The organic EL layer can emit light at a high instantaneous luminance by applying a high voltage to the organic EL layer. In this case, however, the organic EL layer can easily deteriorate.

In the passive matrix type EL display apparatus, the larger the number of common lines and data lines, the more possibility of the occurrence of crosstalk. This makes it difficult to enable the passive matrix type EL display apparatus to display a highly precise image.

Proposed as a display apparatus free from the above-described problems is an active matrix type display apparatus which includes, as shown in FIG. 22, pairs of thin film transistors which confer a voltage storing capability on the pixels. Each of the pairs of thin film transistors consists of a selection transistor T1 and a drive transistor T2. The selection transistor T1 is connected to a data line DL for supplying a data signal and a gate line GL for supplying a gate signal. The gate electrode of the drive transistor T2 is connected to the selection transistor T1. The source of the drive transistor T2 is connected to a constant voltage line VL. In this display apparatus, as shown in FIG. 23, the thin film transistors T1 and T2 are formed in a pixel area on a glass substrate 101, and the gates of the thin film transistors are covered with a gate insulation film 102. In an area adjacent to the thin film transistors T1 and T2, a transparent anode electrode 103 is provided on the gate insulation film 102. The transparent anode electrode 103 is connected to the drain of the drive transistor T2. A passivation film 104 covers the thin film transistors T1 and T2. A contact hole extending up to the transparent anode electrode 103 is formed in that part of the passivation film 104 which is located on the transparent anode electrode 103. An organic EL layer 106, which absorbs the energy generated due to the recombination of electrons and holes when a current flows, is deposited in the contact hole 105 extending up to the transparent anode electrode 103. A cathode electrode 107, which reflects visible light and which extends over a plurality of pixels, is laminated on the passivation film 104 and the organic EL layer 106. In this EL display apparatus, the efficiency of the injection of carriers into the organic EL layer 106 depends on the ionization potential of the anode electrode 103 and the electron affinity (the work function) of the cathode electrode 107. In order to improve the light emitting efficiency of the organic EL layer 106 which depends on the carrier injection efficiency, the cathode electrode 107 is formed using a material whose work function is low. Since the cathode electrode 107 is normally formed of a metal such as magnesium whose work function is low, the cathode electrode 107 reflects light having a wavelength in a range of wavelength of light which the organic EL layer 106 emits. Due to this, in the above EL display apparatus, the light emitted by the organic EL layer 106 travels through the anode electrode 103 and the substrate 101. The organic EL layer 106 is arranged so as not to overlap the thin film transistors T1 and T2. The purpose of thus arranging the organic EL layer 106 is to prevent the light emitted by the organic EL layer 106 from entering the thin film transistors T1 and T2. If the emitted light entered the thin film transistors T1 and T2, unnecessary photoelectromotive force would be generated in the channel regions of the thin film transistors T1 and T2, which entails the possibility of the thin film transistors T1 and T2 malfunctioning.

In the active matrix type EL display apparatus described above, the light emitting area of each pixel in which a part of the organic EL layer 106 is located is limited to an area in which the thin film transistors T1 and T2 are not located, and therefore the ratio of the light emitting area to the pixel area is small. If the light emitting area is enlarged and if a voltage applied to the organic EL layer 106 is intensified to attain the desired luminance, the organic EL layer 106 will be considerably deteriorated. The cathode electrode 107 is made of a metal, while the organic EL layer 106 is made of an organic material. Hence, it is difficult to join the cathode electrode 107 and the organic EL layer 106 together in a preferred condition. As time passes, a gap can easily occur between the cathode electrode 107 and the organic EL layer 106, which entails the possibility that the organic EL layer 106 may become emit no light. The organic EL layer can emit light at the same luminance as that of an inorganic EL layer even when the organic EL layer is formed as thin as 40 nm to 250 nm. The thicker the organic EL layer 106, the higher an effective voltage/current for causing the organic EL layer to emit light at the desired luminance. This limits the range of value at which the thickness of the organic EL layer can be set Meanwhile, the thickness of the passivation film 104, which covers the thin film transistors T1 and T2, is set at such a value as to prevent the occurrence of a parasitic capacitance in the thin film transistors T1 and T2. Owing to a difference in thickness between the passivation film 104 and the organic EL layer 106, a step is present on the upper surfaces of the passivation film 104 and organic EL layer 106. There is the possibility that the cathode electrode 107 may break at that step. If the cathode electrode 107 breaks, the display apparatus cannot perform a display operation.

SUMMARY OF THE INVENTION

It is accordingly one object of the present invention to provide a display apparatus which has a light emitting area enlarged so as to emit light at a satisfactorily high luminescence even though a voltage applied to an EL layer is low, and which has a long luminance life.

It is another object of the present invention to provide a display apparatus which prevents light from entering active elements such as transistors, to thereby avoid the malfunction of the active elements.

In order to achieve the above objects, a display apparatus according to one aspect of the present invention comprises:

a substrate;

active elements which are formed over the substrate and which are driven by an externally supplied signal;

an insulation film formed over the substrate so as to cover the active elements and having at least one contact hole;

at least one first electrode formed on the at least one insulation film so as to cover the active elements, and connected to the active elements through the at least one contact hole, the at least one first electrode being made of a material which shields visible light;

an electroluminescent layer formed on the at least one first electrode and including at least one layer which emits light in accordance with a voltage applied to the at least one layer; and at least one second electrode formed on the electroluminescent layer.

In this display apparatus, the at least one first electrode is formed so as to cover the active elements, and the electroluminescent layer and the at least one second electrode are laminated sequentially on the at least one first electrode. Under those conditions, the area occupied by an electroluminescent element, which is formed of the at least one first electrode, the electroluminescent layer and the at least one second electrode, is not limited by the active elements, and a light emitting area can be enlarged accordingly. This enables the electroluminescent layer to emit light at the same luminescence as that of a conventional display apparatus, even though a voltage applied to the electroluminescent layer is low. In this case, the load on the electroluminescent layer is small, which ensures a long life to the display apparatus. Since the at least one first electrode is made of a material which shields visible light, the light emitted by the electroluminescent layer does not enter the active elements, and therefore the active elements do not malfunction due to the light.

In order to achieve the above-described objects, a display apparatus according to the second aspect of the present invention comprises:

a substrate;

selection transistors formed over the substrate and arranged in a matrix pattern;

drive transistors formed over the substrate and arranged in a matrix pattern, each of the drive transistors being connected to one of the selection transistors;

address lines connected to the selection transistors and through which a signal for turning on the selection transistors is supplied;

data lines connected to the selection transistors, a signal which corresponds to image data being supplied to the drive transistors through the data lines and the selection transistors while the selection transistors is on;

an insulation film formed over the substrate so as to cover the drive transistors, the address lines and the data lines, the insulation film having contact holes formed in correspondence with the drive transistors;

first electrodes made of a material which shields visible light, and formed on the insulation film so as to cover the election transistors and the drive transistors, the first electrodes being arranged in a matrix pattern in areas surrounded by the address lines and the data lines, and being connected to the drive transistors through the contact holes;

an electroluminescent layer formed on the first electrodes and including at least one layer which emits light in accordance with an applied voltage;

a second electrode formed on the electroluminescent layer, a first driver circuit for selectively supplying the address signal to the address lines in sequence; and a second driver circuit for supplying the image data to the data lines.

In this display apparatus, the first electrodes are arranged in the areas surrounded by the address lines and the data lines. Under this condition, electroluminescent elements, each being formed of one of the first electrodes and the electroluminescent layer and the second electrode, do not overlap the address lines or the data lines. Consequently, no parasitic capacitance occurs between the address/data lines and the electrodes of the electroluminescent elements, thus preventing signal transmission from being slowed down.

DETAILED DESCRIPTION OF THE PREFERRED EMBODIMENT

Display apparatuses according to embodiments of the present invention will now be described in detail, with reference to the accompanying drawings.

Figure 1:
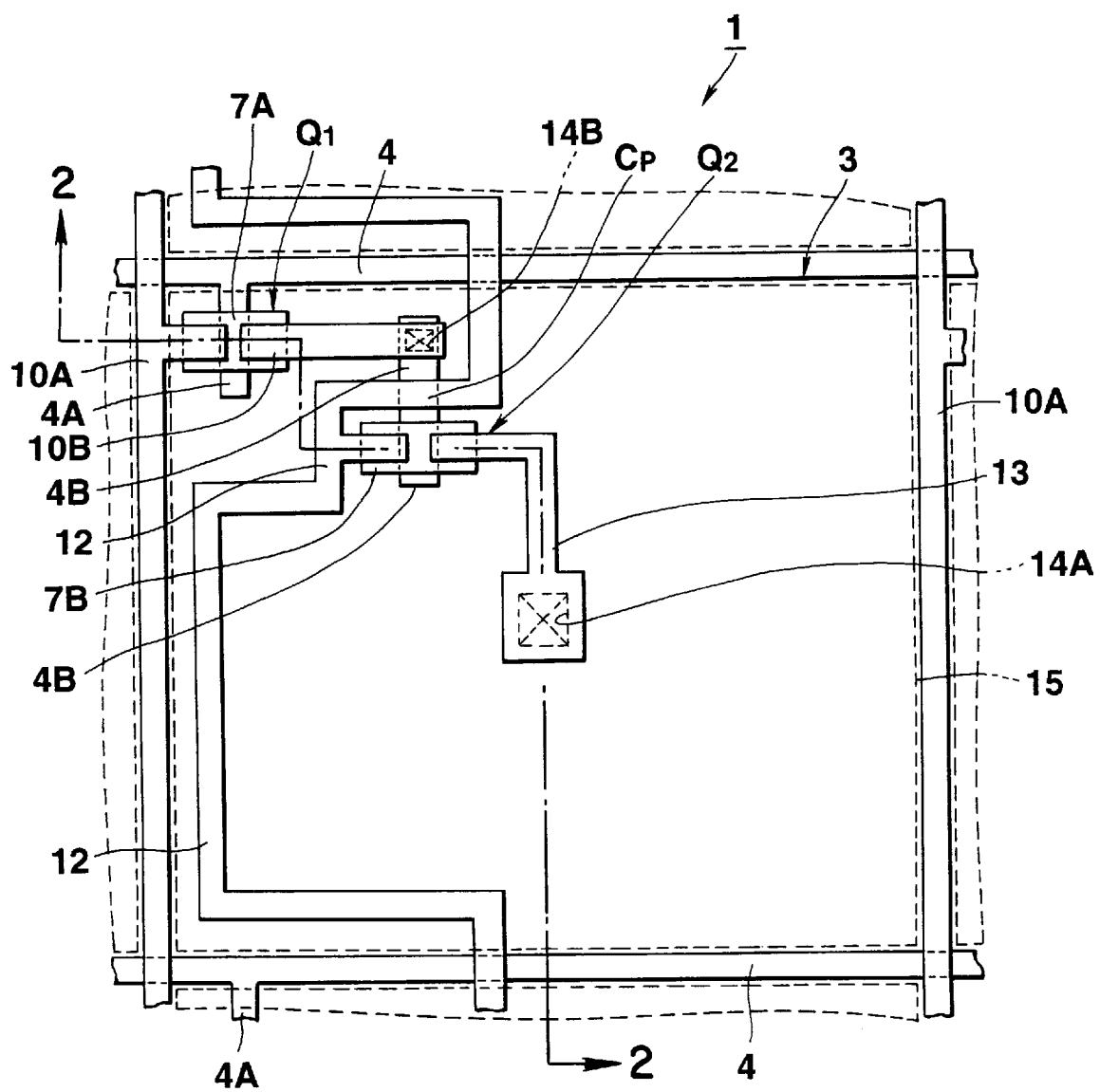
FIG. 1 is a plan view of an display apparatus according to one embodiment of the present invention.
Figure 2:
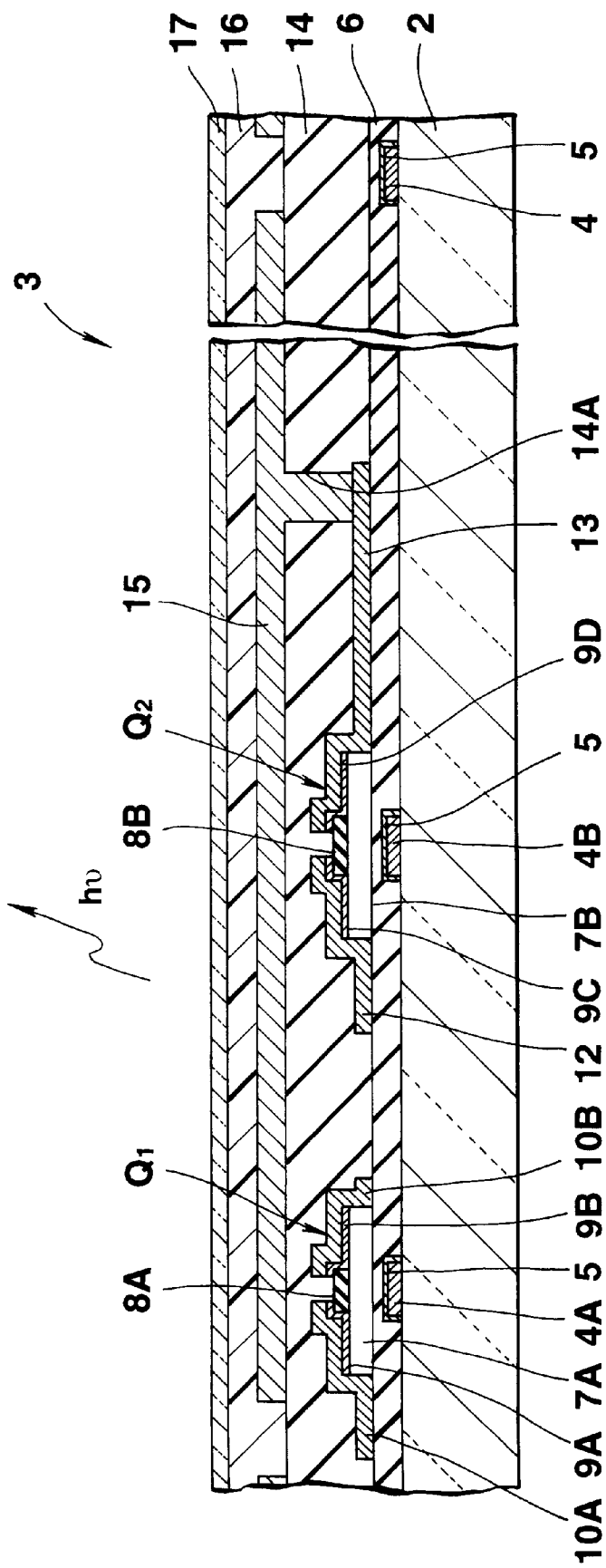
FIG. 2 is a cross section taken along the line 2—2 show in FIG. 1.

The structure of the display apparatus according to one embodiment of the present invention will now be described with reference to FIGS. 1 and 2. FIG. 1 is a plan view of that part of the display apparatus of this embodiment which corresponds to one pixel. FIG. 2 is a cross section taken along the line 2—2 shown in FIG. 1. In those drawings, a reference numeral 1 denotes the display apparatus. That part of the display apparatus 1 which is illustrated in FIGS. 1 and 2 includes a substrate 2, an n-channel transistor Q1, an n-channel transistor Q2, an organic EL element 3, etc. which are formed over the substrate 2. The substrate 2 is made of glass or synthetic resin, and make visible light pass through. The n-channel transistor Q1 serves as a selection transistor, while the n-channel transistor Q2 serves as a drive transistor.

The structure of the display apparatus 1 will be more specifically described. Parallel address lines 4 extending in a predetermined direction are formed at equal intervals on the substrate 2 by patterning a gate metal film which is made of aluminum (Al) or the like. The selection transistor Q1 has a gate electrode 4A formed in integration with one address line 4. The drive transistor Q2 has a gate electrode 4B. Anodic oxidation films 5 are formed on the gate electrodes 4A and 4B and the address lines 4. A gate insulation film 6 which is made of silicon nitride is formed so as to cover the address lines 4, the gate electrodes 4A and 4B and the substrate 2. Semiconductor layers 7A and 7B, which are made of amorphous silicon (a-Si) or polycrystalline silicon (p-Si), are patterned on the gate insulation film 6 covering the gate electrodes 4A and 4B. Blocking layers 8A and 8B are formed on the middle portions of the semiconductor layers 7A and 7B, respectively, and extend in a channel widthwise direction. Ohmic layers 9A and 9B are formed on the semiconductor layer 7A, and are isolated from each other at the blocking layer 8A. The ohmic layer 9A is located on that side (the drain side) of the semiconductor layer 7A which is dose to a drain, while the ohmic layer 9B is located on that side (the source side) of the semiconductor layer 7A which is close to a source. Ohmic layers 9C and 9D are formed on the semiconductor layer 7B, and are isolated from each other at the blocking layer 8B. The ohmic layer 9C is located on the drain side of the semiconductor layer 7B, while the ohmic layer 9D is located on the source side of the semiconductor layer 7B. In the selection transistor Q1, a data line 10A is laminated on and connected to the ohmic layer 9A located on the drain side, and a source electrode 10B is laminated on and connected to the ohmic layer 9B located on the source side. The source electrode 10B is connected to a contact hole 11 formed in the gate insulation film 6 of the drive transistor Q2. In the drive transistor Q2, a constant voltage line 12 which is set at a ground potential is laminated on and connected to the ohmic layer 9C located on the drain side, and a source electrode 13 having two ends is laminated on the ohmic layer 9D located on the source side. One end of the source electrode 13 is connected to the ohmic layer 9D, while the other end of the source electrode 13 is connected to one of cathode electrodes 15 of organic EL elements 3. The gate electrode 4B, the constant voltage line 12 and the gate insulation film 6 therebetween form a capacitor Cp.

The structures of the organic EL elements 3 will now be described. In the entire display area of the display apparatus, a flat interlayer insulation film 14 is deposited to a thickness of about 400 nm to 1200 nm on selection transistors Q1, drive transistors Q2 and the gate insulation film 6. Contact holes 14A are formed in those parts of the interlayer insulation film 14 which are located at end portions of the source electrodes 13 of the drive transistors Q2. Each of the contact holes 14A and a corresponding one of the aforementioned end portions of the source electrodes 13 are located almost in the center of one pixel area. The cathode electrodes 15 which are made of MgIn or the like are patterned on the interlayer insulation film 14. Each cathode electrode 15 has an area and a shape (almost square in this embodiment) which are enough to cover the most part of one pixel area surrounded by the adjacent data lines 10A and the adjacent address lines 4. The selection transistors Q1 and the drive transistors Q2 are formed under the cathode electrodes 15.

In the entire display area, an organic EL layer 16 is formed on the cathode electrodes 15 and the interlayer insulation film 14, and a transparent anode electrode 17 which is made of ITO (indium tin oxide) or IZnO (indium zinc oxide) is formed on the organic EL layer 16. A driving power source (not shown) is connected to the anode electrode 17.

The organic EL layer 16 includes an electron carrying layer, a luminous layer and a hole carrying layer. Of those layers included in the organic EL layer 16, the electron carrying layer is closest to the cathode electrodes 15, and the hole carrying layer is farthest from the cathode electrodes 15. The electron carrying layer is made of aluminum-tris (8-hydroxyquinolinate) (hereinafter referred to as Alq3). The luminous layer is made of 96 wt % 4,4'-bis(2,2-diphenylvinylene)biphenyl (hereinafter referred to as DPVBi) and 4 wt % 4,4'-bis((2-carbazole)vinylene)biphenyl (hereinafter referred to as BCzVBi). The hole carrying layer is made of N,N'-di($\alpha$-naphthyl)-N,N'-diphenyl-1,1'-biphenyl-4,4'-diamine (hereinafter referred to as $\alpha$-NPD). The thickness of the organic EL layer 16 is on the order of 40 nm to 250 nm.

The constitutional formulas of Alq3, DPVBi, BCzVBi and $\alpha$-NPD are shown below:

[Formula 1]

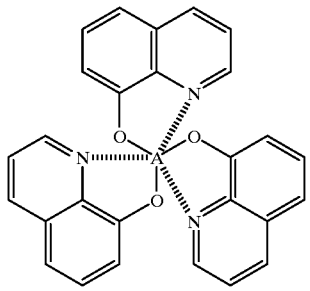

[Formula 2]

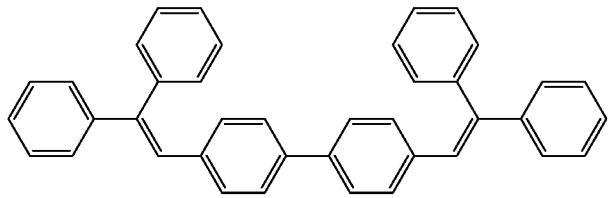

[Formula 3]

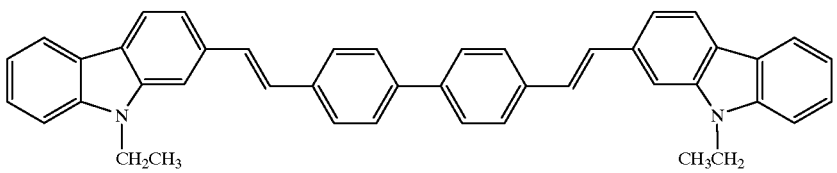

[Formula 4]

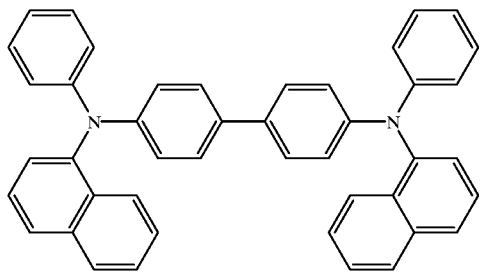

The organic EL layer 16 thus formed emits blue light upon the application of a predetermined voltage.

When the organic EL layer 16 between the anode electrode 17 and the cathode electrodes 15 includes a luminous layer which can carry electrons and which is made of berylliumbis(10-hydroxybenzo[h] quinolinate) (hereinafter referred to as Bebq2), and a hole carrying layer made of α-NPD, the organic EL layer 16 can emit green light.

The constitutional formula of Bebq2 is shown below:

[Formula 5]

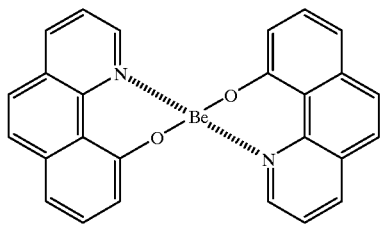

In the display apparatus 1 of this embodiment, each cathode electrode 15 covers one pixel area surrounded by the adjacent data lines 10A and the adjacent address lines 4, and therefore each EL element 3 emits light over the entirety of one pixel area. This remarkably improves the aperture ratio per pixel in the display apparatus 1 of this embodiment over that of the conventional active matrix type EL display apparatus. The cathode electrodes 15 are formed of MgIn which reflects light. Therefore, the light emitted by the organic EL layer 16 when a voltage is applied between the anode electrode 17 and the cathode electrodes 15 comes out through the anode electrode 17 without leaking downward (toward the substrate 2). Thus, the light does not enter the selection transistors Q1 and the drive transistors Q2, and hence the malfunction of the transistors Q1 and Q2 due to the photoelectromotive force is avoided. The light emitted by the organic EL layer 16 goes out of the display apparatus through the transparent anode electrode 17, without the light being absorbed by the substrate 2, etc., and therefore bright display is realized.

The area of the interface between the organic EL layer 16 and the cathode electrodes 15 is large. This permits the cathode electrodes 15 and the organic EL layer 16 to be joined together in a preferred condition, and ensures to the display apparatus 1 of this embodiment a luminous life improved over that of the conventional active matrix type EL display apparatus. The cathode electrodes 15 are formed on a flat layer having no steps, and therefore are free from the possibility of the cathode electrodes 15 breaking at steps. The cathode electrodes 15 are arranged so as not to overlap the address lines 4 or the data lines 10A. Consequently, the slowing down of signal transmission, caused by a parasitic capacitance which would occur if the cathode electrodes 15 were arranged so as to overlap the address lines 4 or the data lines 10A, is prevented.

When a layer like the organic EL layer 16 is subjected to a temperature higher than a glass-transition temperature for an organic EL material, its light emitting characteristic deteriorates considerably. In consideration of this, according to the display apparatus of this embodiment, the organic EL layer 16 is formed after the selection transistors Q1 and the drive transistors Q2 are manufactured by a heat treatment under a temperature of several-hundred degrees. The organic EL layer 16 is not subjected to a temperature higher than the glass-transition temperature, and therefore the deterioration of the light emitting characteristic does not occur.

The organic EL layer 16 is thinner than an inorganic EL layer. Moreover, the thickness to which the organic EL layer is formed through vapor deposition using the organic EL material can be very easily controlled during the process of forming the organic EL layer. When the organic EL layer 16 is formed to the thickness corresponding to the wavelength at the luminance peak of the light emitted by the organic EL layer 16 (in other words, the wavelength of the most intense component of the light emitted by the organic EL layer 16), the resonance effect which permits light to easily come out from the organic EL layer 16 can be achieved. For example, in the case of an organic EL element which emits blue light, the resonance effect can be attained when it is formed to the thickness of 40 nm to 50 nm. In the case of an organic EL element which emits green light, the resonance effect can be attained when it is formed to the thickness of 50 nm to 60 nm.

Figure 3:
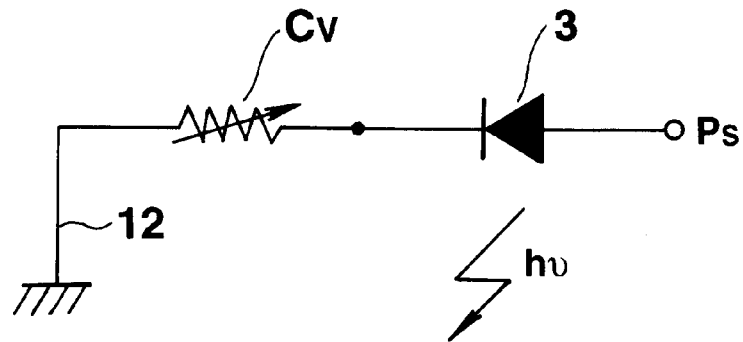
FIG. 3 is an equivalent circuit diagram showing an EL display circuit corresponding to one pixel.
Figure 4:
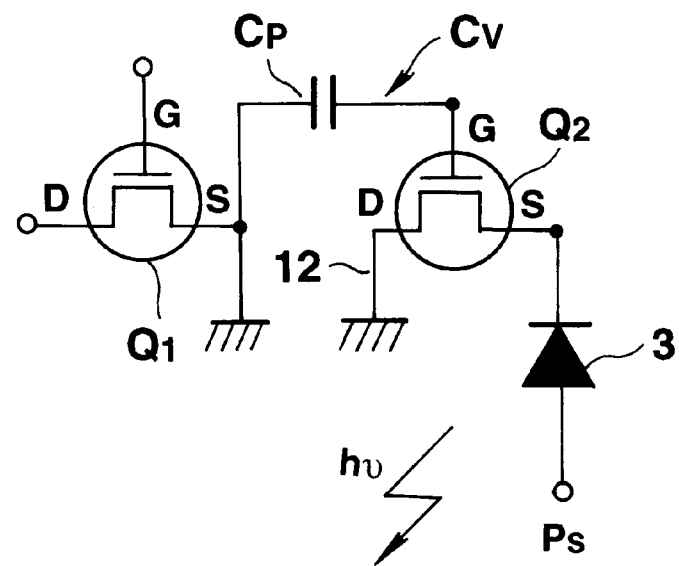
FIG. 4 is an equivalent circuit diagram which specifically shows the structure of the EL display circuit.

The driving principle of the display apparatus according to this embodiment will now be described. FIGS. 3 and 4 are equivalent circuit diagrams showing that part of the display apparatus 1 which corresponds to one pixel. As shown in FIG. 3, a display circuit in that part of the display apparatus 1 which corresponds to one pixel includes an organic EL element 3 and a voltage controller Cv. As shown in FIG. 4, the voltage controller Cv has a selection transistor Q1, a drive transistor Q2 and a capacitor Cp. The driving power source Ps for supplying a constant voltage Vdd is connected to the anode electrode 17 of the organic EL element 3. The voltage controller Cv is connected to the cathode electrode of the organic EL element 3. The drain electrode of the drive transistor Q2 in the voltage controller Cv is grounded via the constant voltage line 12.

The voltage controller Cv can control a voltage so that the luminance of the organic EL element 3 varies in accordance with gradation data corresponding to image data which is input at the time of selection. An address line 4 is connected to the gate electrode 4A of the selection transistor Q1, and a data line 10A is connected to the drain electrode of the selection transistor Q1. The gate of the selection transistor Q1 is turned on in response to a selection signal supplied through the address line 4. While the selection transistor Q1 is on, an image data voltage supplied through the data line 10A is accumulated in the capacitor Cp. The capacitor Cp retains the image data voltage almost over 1 frame period. The resistance in the drive transistor Q2 is controlled by the voltage retained in the capacitor Cp. The organic EL element 3 emits light according to written information, in other words, the retained voltage.

Figure 5:
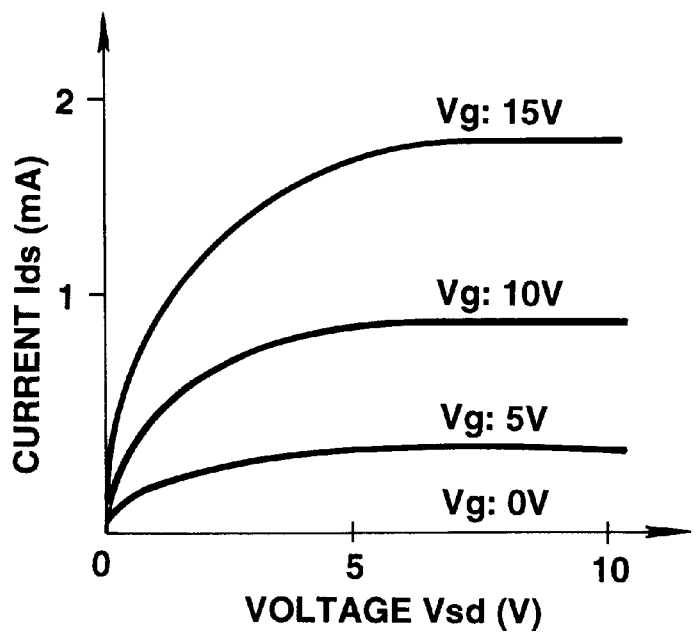
FIG. 5 is a graph showing the electric characteristic of a drive transistor Q2.
Figure 6:
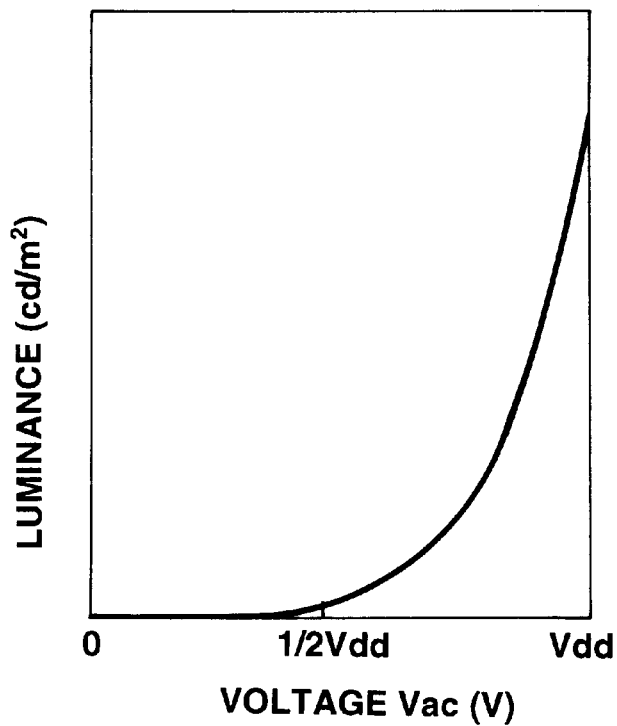
FIG. 6 is a graph showing the luminance of an organic EL element.

The electric characteristic of the organic EL element 3 will now be described with reference to FIGS. 5 and 6. As shown in FIG. 5, the source-drain current Ids of the drive transistor Q2 is shifted in accordance with a gate voltage Vg applied to the gate electrode of the drive transistor Q2. The source-drain current Ids of the drive transistor Q2 becomes saturated when a source-drain voltage Vsd applied between the source and drain of the drive transistor Q2 exceeds approximately 5V. As shown in FIG. 6, the organic EL element 3 has a luminance characteristic according to an anode-cathode voltage Vac (a forward bias is positive). In this embodiment, the luminance (gradation) of the organic EL element 3 is controlled by controlling the anode-cathode voltage Vac in a range of 0(V) to Vdd (M).

The source electrode 10B of the selection transistor Q1 is connected to the gate electrode 4B of the drive transistor Q2 through a contact hole 14B. A writing/deleting voltage is applied to the drain electrode of the selection transistor Q2 through the data line 10A.

Driver circuits used in the display apparatus 1 will now be explained with reference to FIG. 7. As shown in this drawing, one selection transistor Q1, one drive transistor Q2 and one organic EL element 3 are provided in each pixel area. One address line 4 is connected to the gate electrode 4A of each selection transistor Q1. One data line 10A is connected to the drain electrode of each selection transistor Q1. Moreover, as shown in FIG. 8, a selection voltage Vad having a positive potential is applied to a selected one of the address lines 4, and a non-selection voltage Vnad having a ground potential is applied to the other non-selected address lines 4. In the selection periods, a writing voltage Vr according to the luminance is applied to the data lines 10A. The driving power source Ps continually applies the constant voltage Vdd to the anode electrode 17.

The operation of the display apparatus 1 according to this embodiment will now be described.

Figure 7:
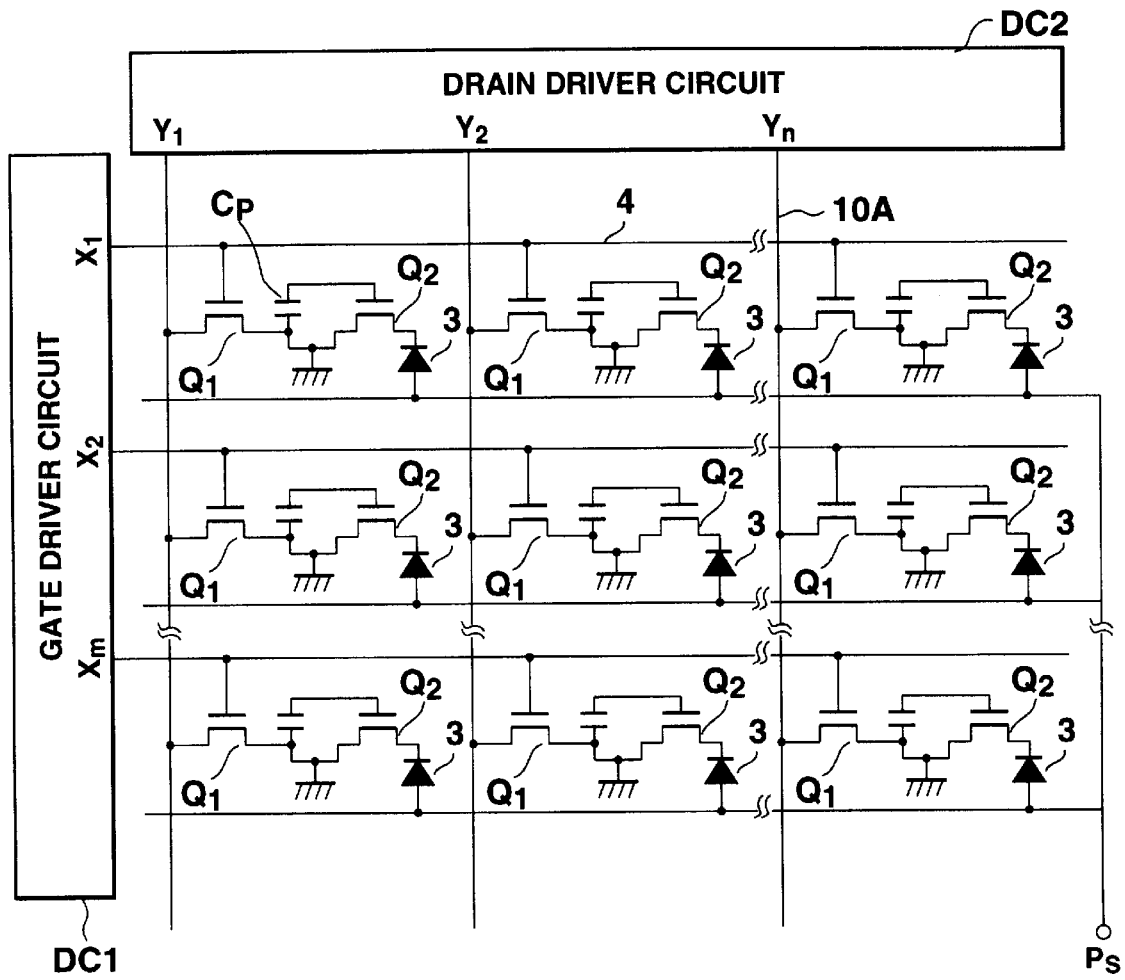
FIG. 7 is a diagram illustrating driver circuits used in the display apparatus depicted in FIG. 1.
Figure 8:
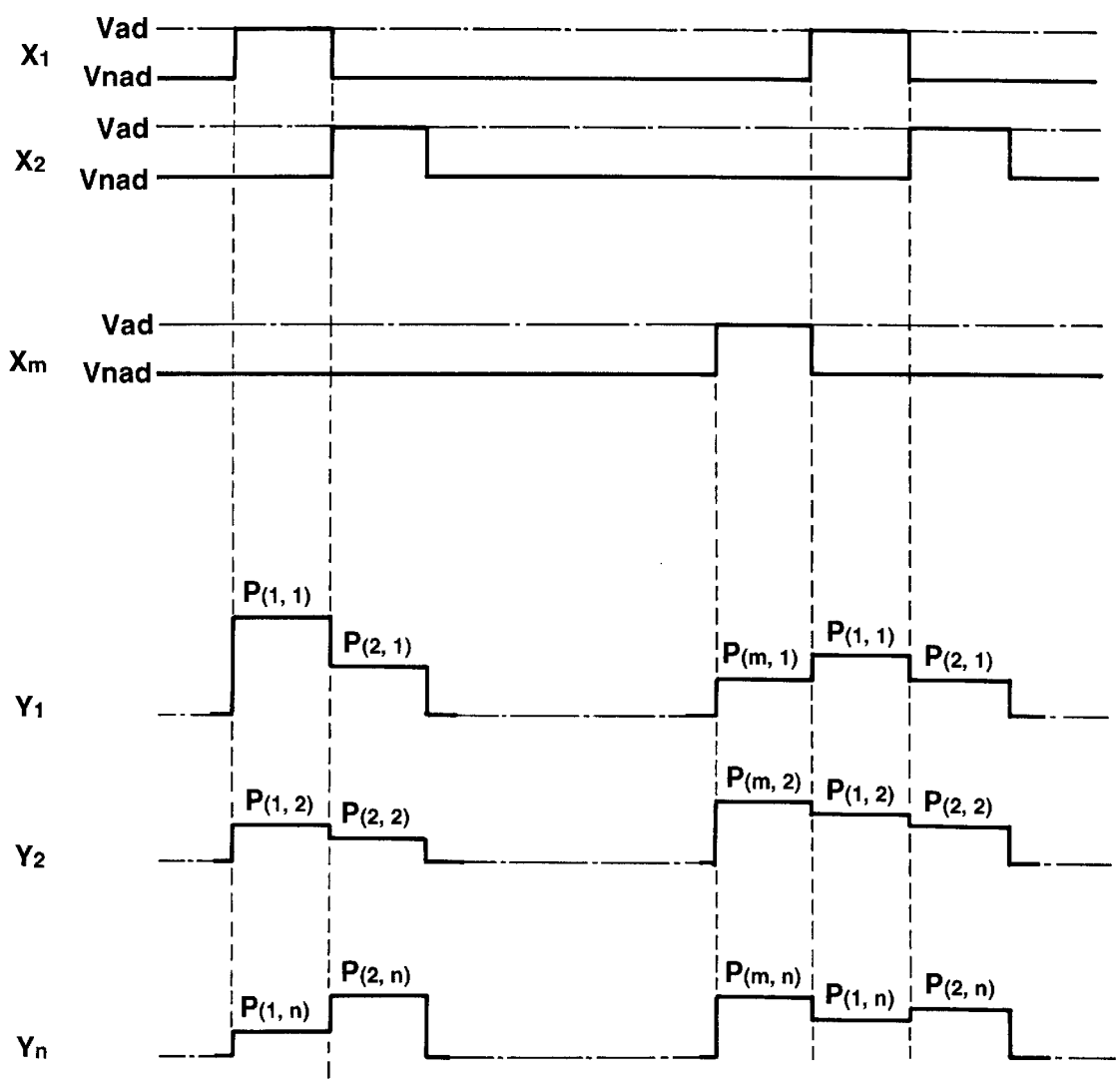
FIG. 8 is a diagram showing waveforms for driving the display apparatus.

A gate driver circuit DC1 illustrated in FIG. 7 applies voltages through its terminals X1 to Xm to the address lines 4, thereby sequentially selecting the address lines 4. When selecting one address line 4 connected to the terminal X1, the gate driver circuit DC1 applies the selection voltage Vad to that address line, and applies the non-selection voltage Vnad to the other address lines. At that time, a drain driver circuit DC2 applies the writing voltage Vr through its terminals Y1 to Yn and the data lines 10A to the drain electrodes of those of the selection transistors Q1 which are connected to the address line 4 connected to the terminal X1. In accordance with the writing voltage Vr, a voltage of 0V to Vdd (V) is applied to those of the organic EL elements 3 which correspond to pixels P (1, 1) to P (1, n), and the organic EL elements 3 applied with the voltage emit light at the luminance (gradation) according to the applied voltage. In a non-selection period during which the address line 4 connected to the terminal X1 is not selected, the capacitors Cp connected to that address line retain the writing voltage Vr over 1 frame period. Consequently, currents keep flowing into the drains of drive transistors Q2 and then into organic EL elements 3 over 1 frame period, and those EL elements emit light over 1 frame period. In place of the selection voltage Vad, the gate driver circuit DC1 applies the non-selection voltage Vnad to the address line 4 connected to the terminal X1. In order to select another address line 4 connected to the terminal X2, the gate driver circuit DC1 applies the selection voltage Vad to the address line 4 connected to the terminal X2. In the same manner as that descried above, those of the organic EL elements 3 which correspond to pixels P (2, 1) to P (2, n) emit light at the luminance according to the applied voltage.

Thus, in the display apparatus 1 of this embodiment, the organic EL elements 3 can keep emitting light even while their corresponding address lines 4 are not selected.

Accordingly, even though the display apparatus 1 is designed to display a highly precise image, the luminance of the organic EL elements 3 need not be set high. For example, in order to attain a luminance of 100 cd/m² at the surface of the screen of a conventional passive matrix type display apparatus, the organic EL elements have to emit light at a luminance of about 48000 cd/m². However, in the case of the display apparatus of this embodiment, a luminance of approx 100 cd/m² suffices as the luminance of the organic EL elements 3.

According to the display apparatus 1 of this embodiment, unlike in the case of the passive matrix type organic EL display apparatus proposed conventionally, the organic EL elements 3 can keep emitting light over 1 frame period, and the display apparatus 1 can display an image without causing the organic EL elements 3 to emit light at a high luminance. The display apparatus 1 of this embodiment can display a highly precise halftone image, and the expressivity of the displayed image is improved. In order to vary a carrier potential at a high speed, a writing voltage which is applied to the data lines 10A while the organic EL elements 3 are emitting no light can be set at a negative potential in accordance with an increase in the number of address lines 4, insofar as a P-channel current is not adversely affected.

Figure 9:
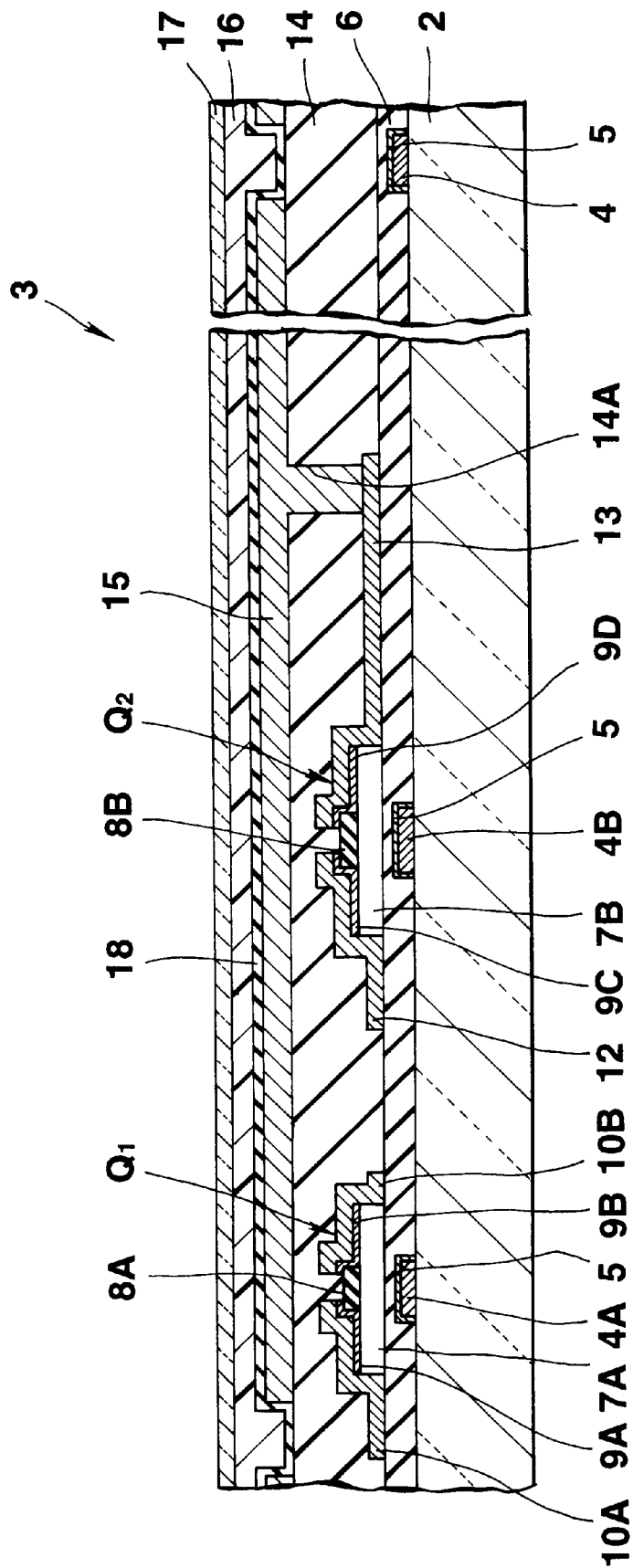
FIG. 9 is a sectional view of a display apparatus which includes cathode electrodes, an organic EL layer, and a dielectric film between the organic EL layer and the cathode electrodes.

Further, as shown in FIG. 9, a dielectric film having a thickness of 5 nm or less and which is formed of at least one material selected from a group consisting of SiO2, Lif, Naf, Caf2 and Mgf2, may be provided between the organic EL layer 16 and the cathode electrodes 15. When a voltage having a predetermined value is applied between the anode electrode 17 and the cathode electrode 15, electrons are injected from the cathode electrodes 15 into the organic EL layer 16 through the dielectric film 18 due to the tunneling effect. After the formation of, for example, the cathode electrodes 15 which are easily oxidized, the dielectric film 18 is formed so as to cover the cathode electrodes 15 by a vacuum deposition method or the like. The cathode electrodes 15 covered by the dielectric film 18 are not exposed to the air. Accordingly, the electron injecting capability of the cathode electrodes 15 is maintained in an excellent condition. It is preferred that the dielectric film 18 be one which can be successfully joined with the cathode electrodes 15 and the organic EL layer 16 in a preferred state.

Figure 10:
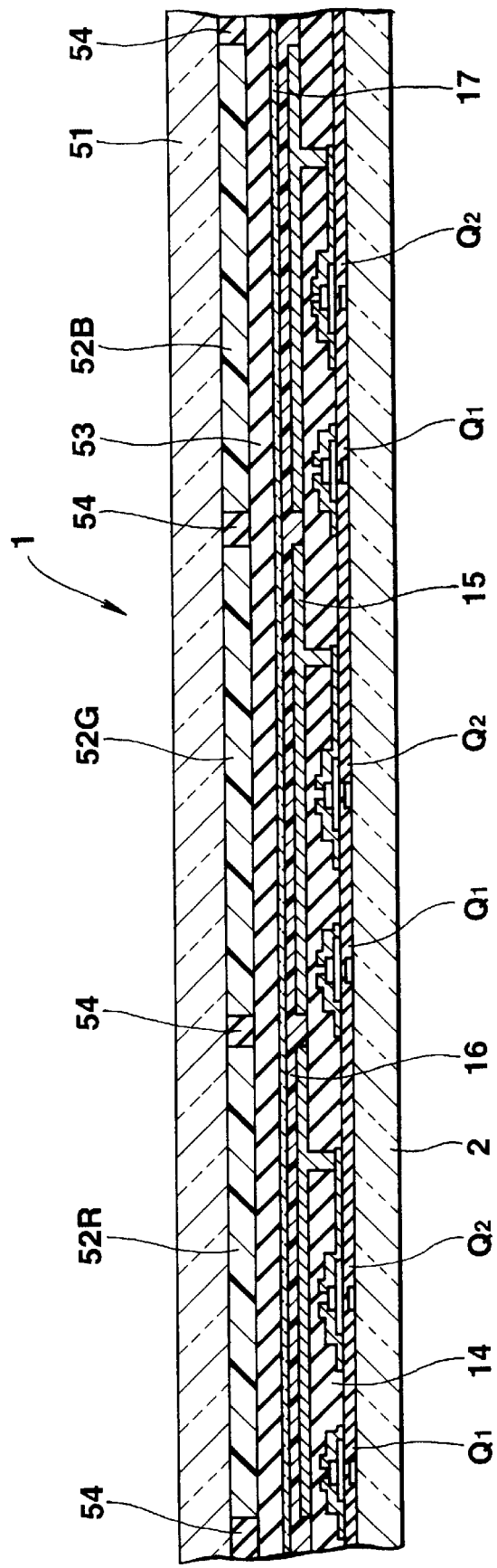
FIG. 10 is a sectional view of a display apparatus having R, G and B wavelength range conversion layers.

In the multicolor (full-color) type display apparatus 1 illustrated in FIG. 10, wavelength range conversion layers 52R, 52G and 52G, sandwiched between an insulation film 53 formed on the anode electrode 17 and a substrate 51, are provided in one-to-one correspondence with the cathode electrodes 15. A black mask containing chromium oxide is formed in the areas corresponding to the address lines 4 and the data lines 10A. The wavelength range conversion layers 52R have the photoluminescence effect of absorbing light which the organic EL layer 16 emits in a blue wavelength range and emitting light in a longer red wavelength range. The wavelength conversion layers 52G have the photoluminescent effect of absorbing light which the organic EL layer 16 emits in the blue wavelength range and emitting light in a longer green wavelength range. The wavelength conversion layers 52B have the photoluminescent effect of absorbing light which the organic EL layer 16 emits in the blue wavelength range and emitting light in a longer blue wavelength range.

In this display apparatus 1, the organic EL layer which emits blue light of a single color is satisfactory. The wavelength conversion layers 52R convert the blue light emitted by the organic EL layer 16 into red light, and emit the converted red light. The wavelength conversion layers 52G convert the blue light emitted by the organic EL layer 16 into green light, and emit the converted green light. The wavelength conversion layers 52B convert the blue light emitted by the organic EL layer 16 into blue light, and emit the converted blue light. Therefore, the display apparatus 1 can easily display a full-color image. The areas occupied by the wavelength conversion layers 52R, 52G and 52B are set equal to those occupied by the cathode electrodes 15, and therefore the light emitting area of each pixel is not small even through the transistors Q1 and Q2 are present. This permits the wavelength conversion layers to perform the energy conversion with efficiency.

It is preferred that a material having a refractive index which approximates to that of the wavelength conversion layers 52R, 52G and 52B, which are in contact with the insulation film 53, be selected as the material of the insulation film 53. This is because when the insulation film 53 is formed of such a material, the degree of the reflection of light at the interface between the insulation film 53 and the wavelength conversion layers 52R, 52G and 52B is small.

Figure 11:
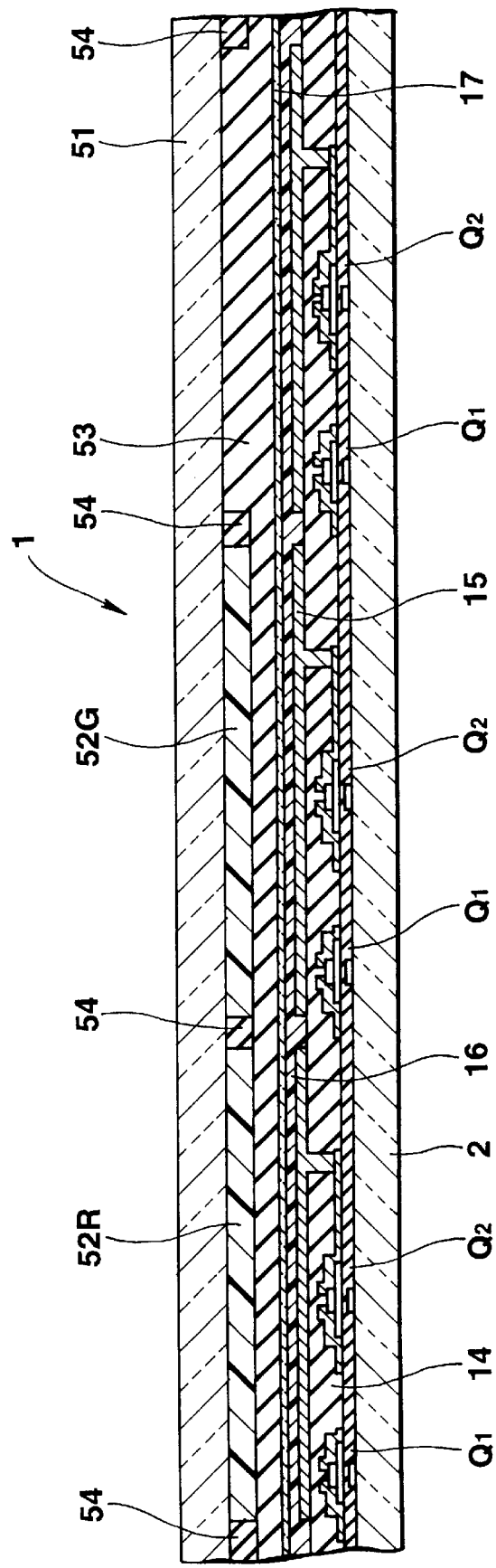
FIG. 11 is a sectional view of a display apparatus having R and G wavelength range conversion layers.

The display apparatus 1 illustrated in FIG. 11 includes the wavelength conversion layers 52R and 52G. This display apparatus 1 displays a multicolor (full-color) image, using as is the blue light emitted by the organic EL layer 16.

Figure 12:
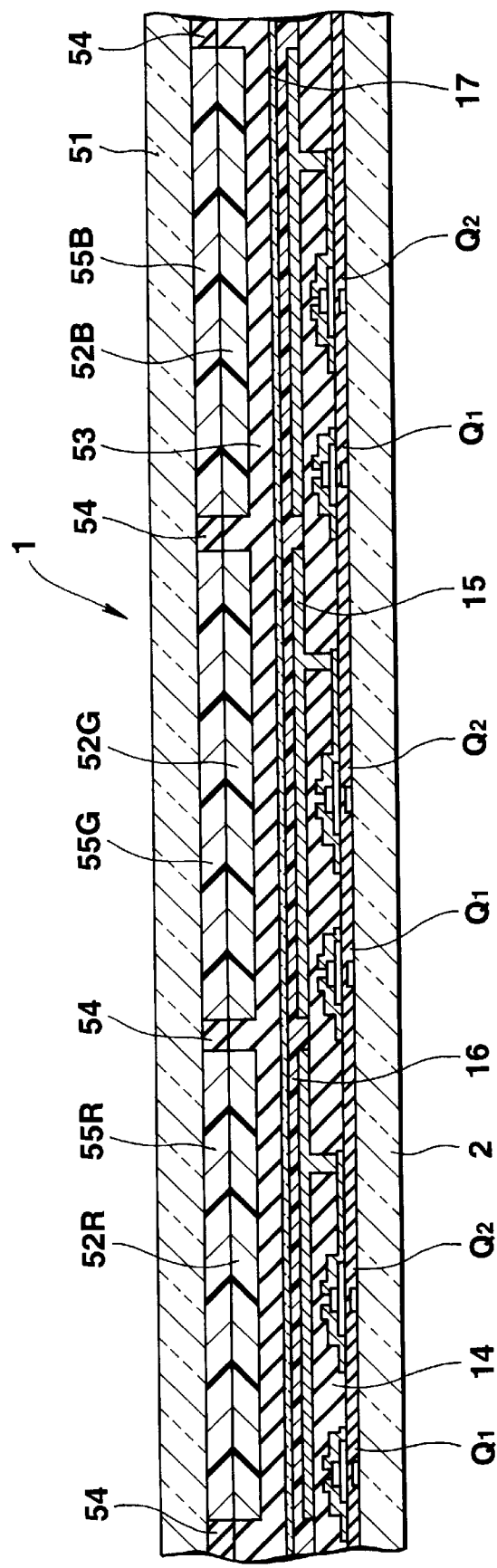
FIG. 12 is a sectional view of a display apparatus having R, G and B wavelength range conversion layers and color filter layers.

In the display apparatus 1 illustrated in FIG. 12, color filters 55R, 55G and 55B are provided between a substrate 1 and the wavelength conversion layers 52R, 52G and 52B, respectively. Of the light incident on the color filter layers 52R, the light components in the red wavelength range pass through the color filter layers 52R, but the light components in the other wavelength ranges are absorbed by the color filter layers 52R. Of the light incident on the color filter layers 52G, the light components in the green wavelength range pass through the color filter layers 52G, but the light components in the other wavelength ranges are absorbed by the color filter layers 52G. Of the light incident on the color filter layers 55B, the light components in the wavelength range in which the blue light emitted by the wavelength conversion layers 52B falls pass through the color filter layers 55B, but the other light components are absorbed by the color filter layers 55B. In other words, the color filter layers 55B absorb the blue light emitted by the organic EL layer 16, but allow the blue light emitted by the wavelength conversion layers 52B to pass through the color filter layers 55B.

The color filter layers 55R have such a characteristic that they absorb, of the incident light entering the wavelength conversion layers 52R through the substrate 51, the light components in the wavelength range of the light by which the wavelength conversion layers 52R are excited (i.e., the light components in the same wavelength range as that in which excitation light components of the blue light emitted by the organic EL layer 16 fall). Under this condition, the wavelength conversion layers 52R are not excited by the light coming from the outside of the display apparatus 1. The color filter layers 55G have such a characteristic that they absorb, of the incident light entering the wavelength conversion layers 52G through the substrate 51, the light components in the wavelength range of the light by which the wavelength conversion layers 52G are excited (i.e., the light components in the same wavelength range as that in which of the excitation light components of the blue light emitted by the organic EL layer 16 fall). Therefore, the color conversion layers 52G are not excited by the external light coming from the outside of the display apparatus 1. The wavelength conversion layers 52B emit blue light in a blue wavelength range wider than that of the blue light emitted by the organic EL layer 16. The color filter layers 55B have such a characteristic that they absorb the blue light emitted by the organic EL layer 16 but allow the blue light emitted by the wavelength conversion layers 52B to pass through the color filter layers 55B. Consequently, the wavelength conversion layers 52B are not excited by the external light coming from the outside of the display apparatus 1.

When the light emitted by the wavelength range conversion layers 52R, 52G and 52B enter the color filter layers 55R, 55G and 55B, light in narrower wavelength ranges than those of the light emitted by the layers 52R, 52G and 52B and having higher luminance peaks than those of the light emitted by the layers 52R, 52G and 52B, come out from the filter layers 55R, 55G and 55B. Accordingly, the color purity of light going outside the display apparatus 1 is high. The black mask 54 shields areas between the color filter layers 55R, 55G and 55B from the external light radiated toward those areas, and therefore the external light do not enter the wavelength conversion layers 52R, 52G and 52B so as to cause the layers 52R, 52G and 52B to perform light emission. The black mask 54 also prevents light from being reflected by the address lines 4 and the data lines 10A. This ensures a considerably excellent display characteristic to the display apparatus 1. Since no light enters also the transistors Q1 and Q2 by virtue of the presence of the black mask 54 and cathode electrodes 17, the malfunction of the transistors Q1 and Q2 does not occur.

Figure 13:
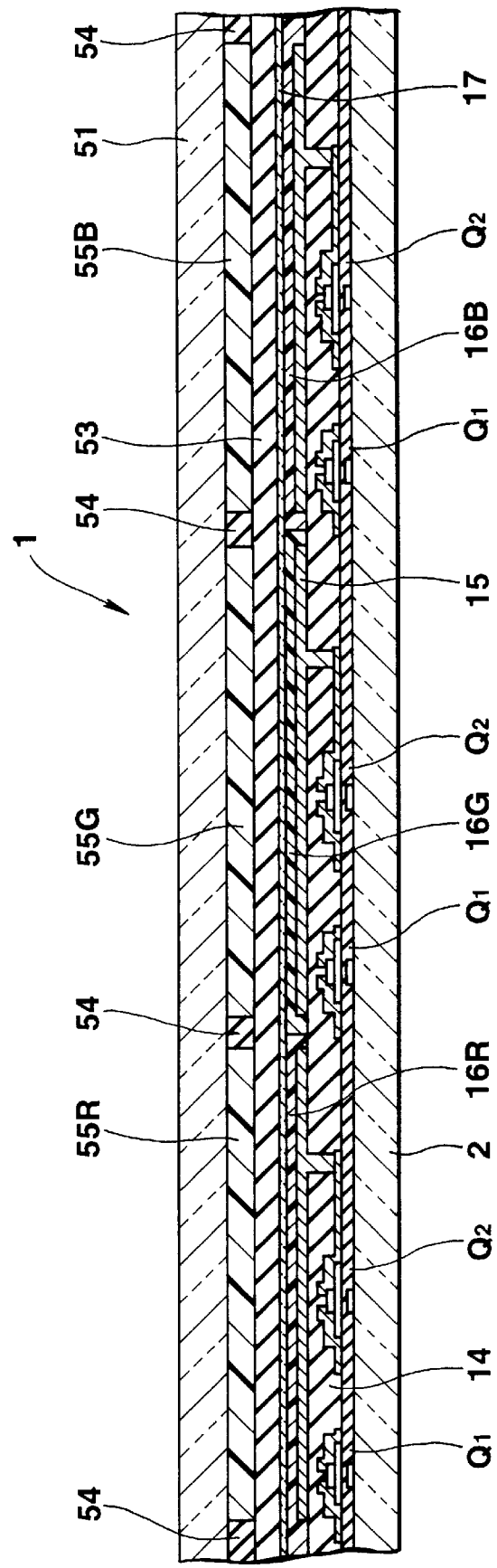
FIG. 13 is a sectional view of a display apparatus having color filter layers.

As shown in FIG. 13, the organic EL layer 16 may include a red EL layer 16R, a green EL layer 16G and a blue EL layer 16B. It is possible to cause light emitted by those EL layers 16R, 16G and 16B to enter the color filter layers 55R, 55G and 55B, respectively, and to come out therefrom as light having higher luminance peaks.

Figure 14:
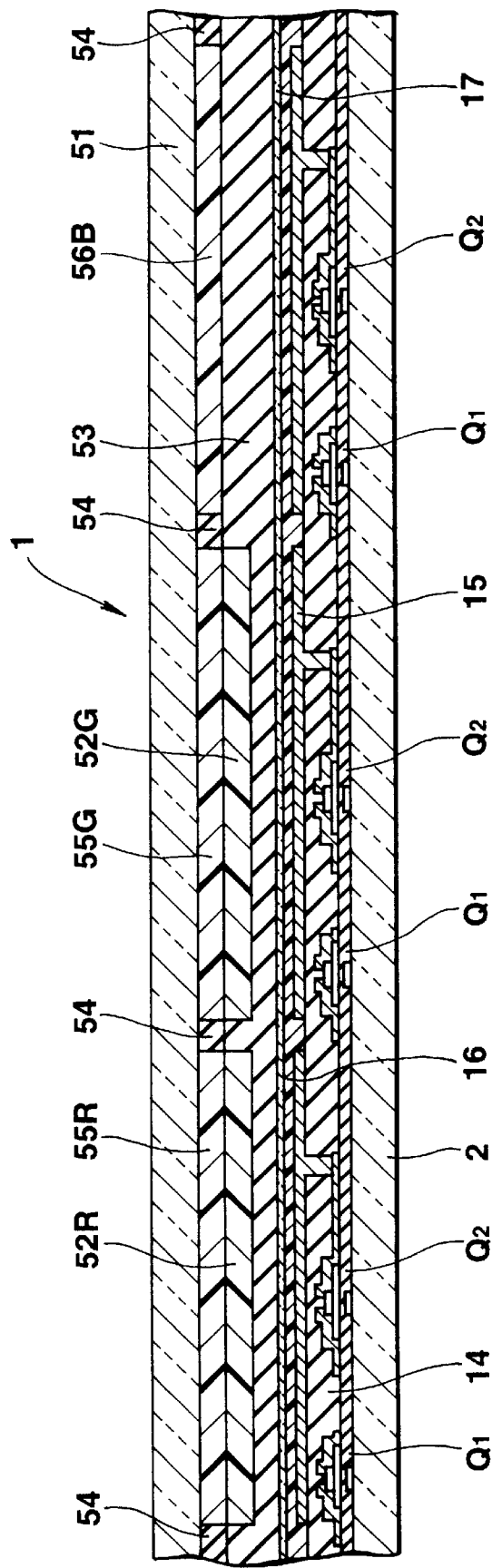
FIG. 14 is a sectional view of a display apparatus having R and G wavelength range conversion layers and color filter layers.

In FIG. 14, color filter layers 56B have such a characteristic that when the blue light emitted by the organic EL layer 16 enters the color filter layers 56B, blue light in a narrower wavelength range than that of the blue light emitted by the organic EL layer 16 and having a higher luminance peak than that of the blue light emitted by the organic EL layer 16, comes out from the color filter layers 56B. Hence, without using a wavelength conversion layer for blue, the display apparatus 1 illustrated in FIG. 14 can display a full-color image if the wavelength conversion layers 52R and 52B are provided in correspondence with the color filter layers 55R and 55G.

Figure 15:
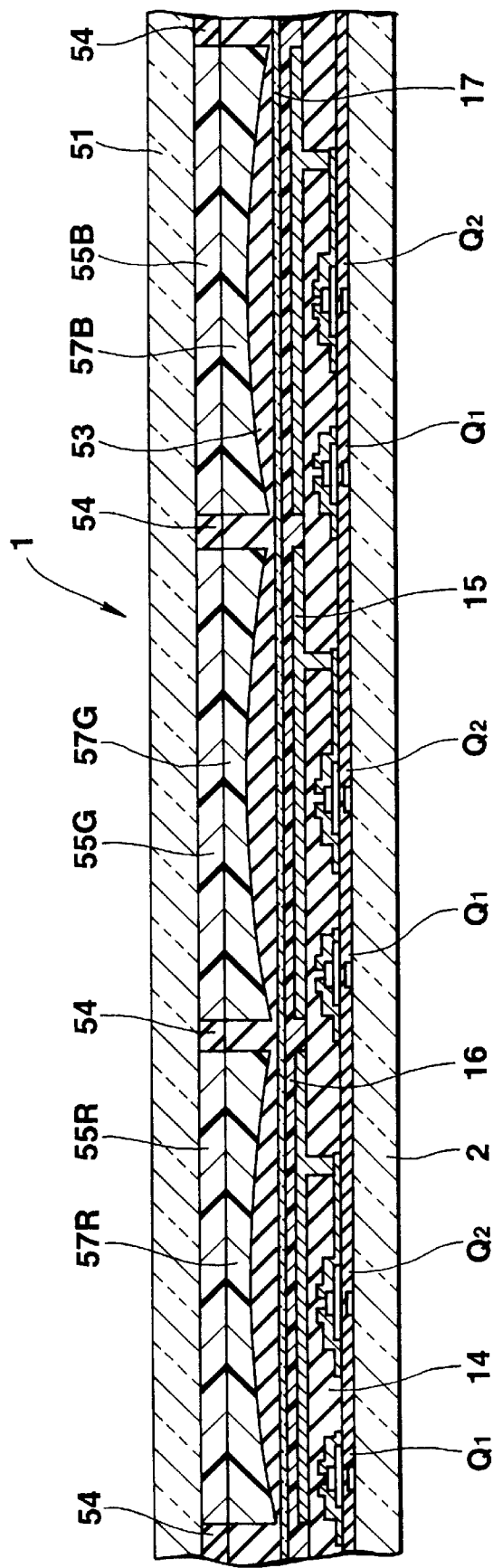
FIG. 15 is a sectional view of a display apparatus having concave R, G and B wavelength range conversion layers and color filters.

The display apparatus 1 illustrated in FIG. 15 has wavelength conversion layers 57R, 57G and 57B each having a concave surface facing the organic EL layer 16. Even when the light emitted by the organic EL layer 16 is reflected at the interfaces between the insulation film 53 and the wavelength conversion layers 57R, 57G and 57B, the most part of the reflected light is reflected by the cathode electrodes 15. The light reflected by the cathode electrodes 15 falls on the interfaces between the insulation film 53 and the wavelength conversion layers 57R, 57G and 57B at an incident angle different from the initial incident angle. Under this condition, it is easy for the wavelength conversion layers 57R, 57G and 57B to catch the light reflected by the cathode electrodes 15. Thus, in the display apparatus 1 illustrated in FIG. 15, the light emitted by the organic EL layer 16 enters the wavelength conversion layers 57R, 57G and 57B without the light being wasted.

Figure 16:
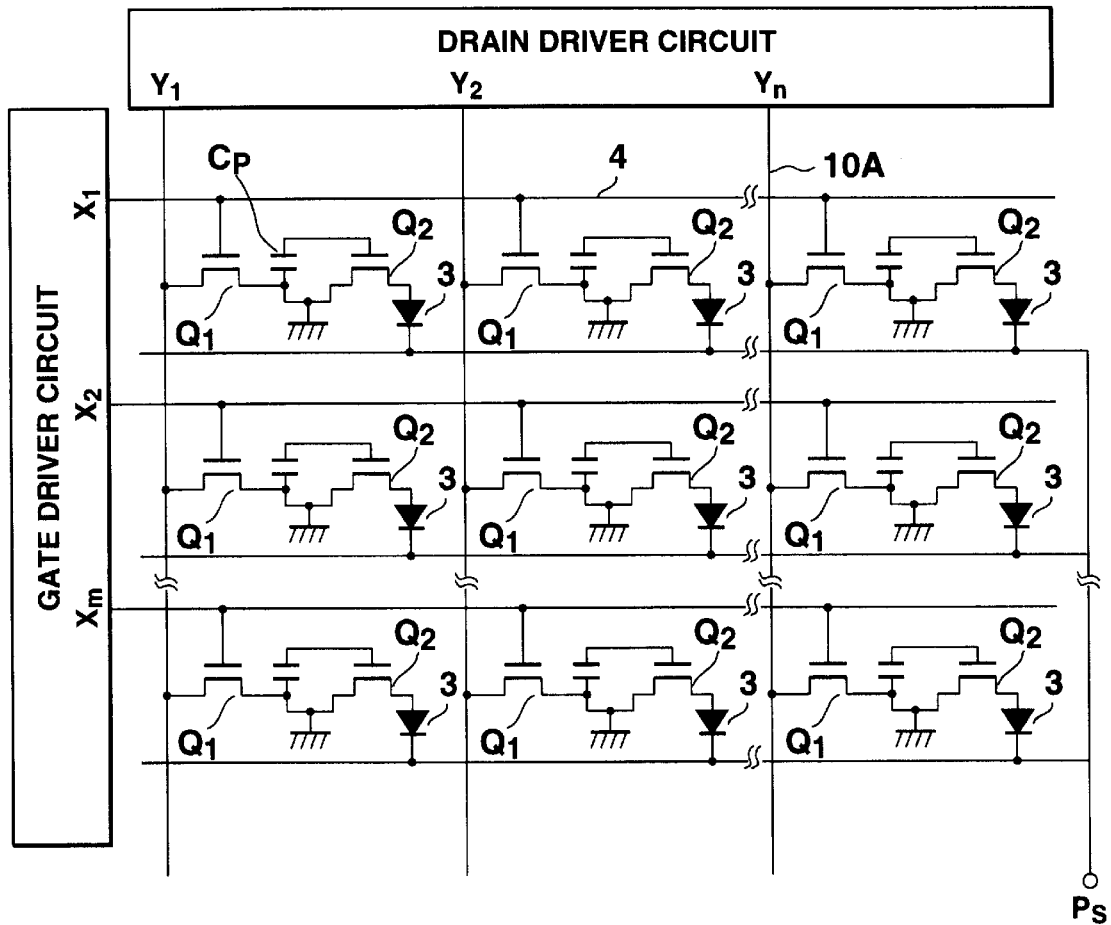
FIG. 16 is a diagram showing driver circuits used in a display apparatus which includes drive transistors Q2 and anode electrodes connected to the drive transistors Q2.

The display apparatus 1 of the above embodiment has the structure shown in FIG. 7. However, as shown in FIG. 16, the positions of the anode and cathode electrodes can be reversed. In this case, the driving power source Ps continually applies a constant negative voltage (-Vdd) to the cathode electrodes of the organic EL elements 3.

It is possible to provide the dielectric film 18 shown in FIG. 9 between an anode electrode 16 and the cathode electrodes 15 in the display apparatuses 1 illustrated in FIGS. 10 to 15.

Figure 17:
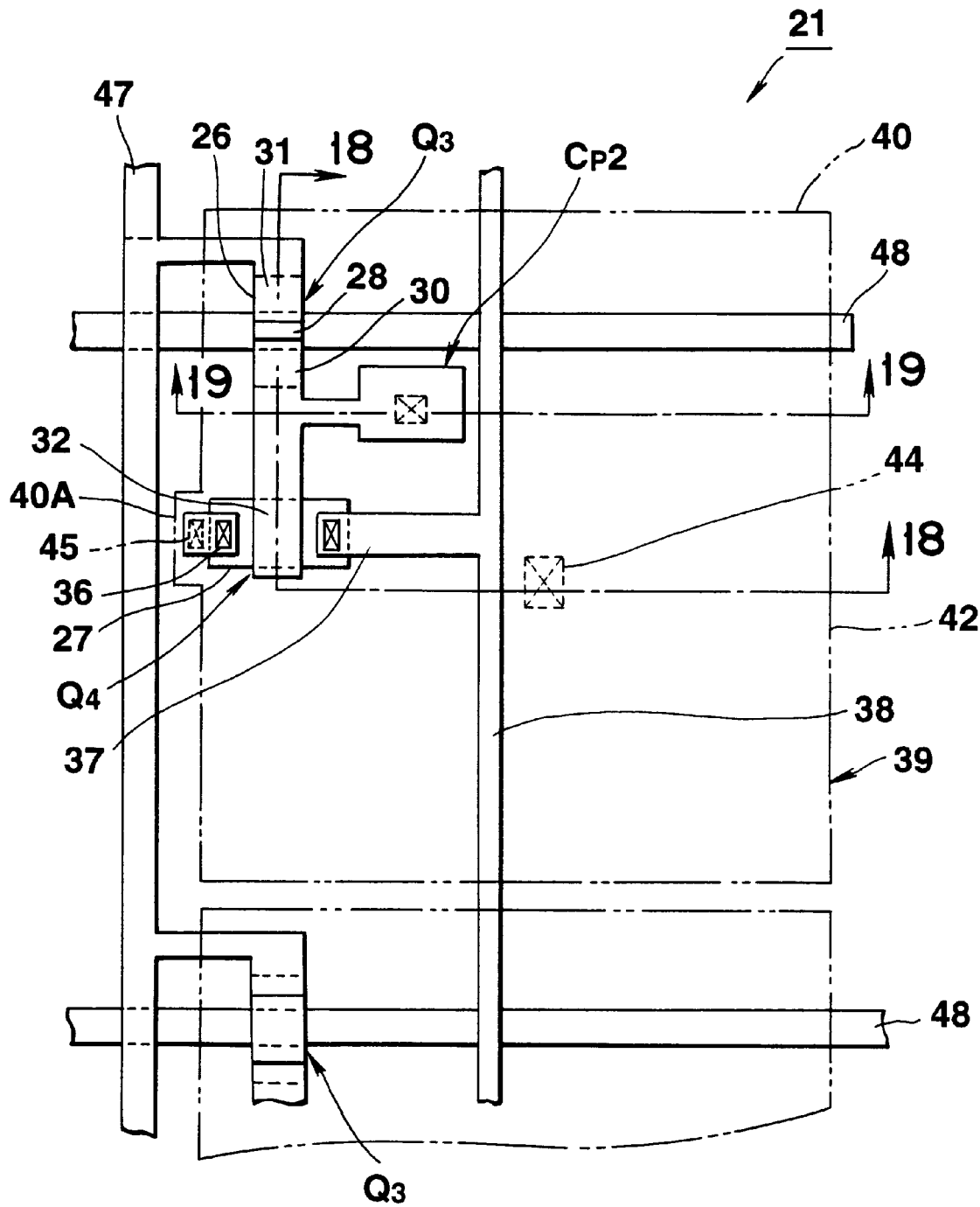
FIG. 17 is a plan view of a display apparatus according another embodiment of the present invention.
Figure 18:
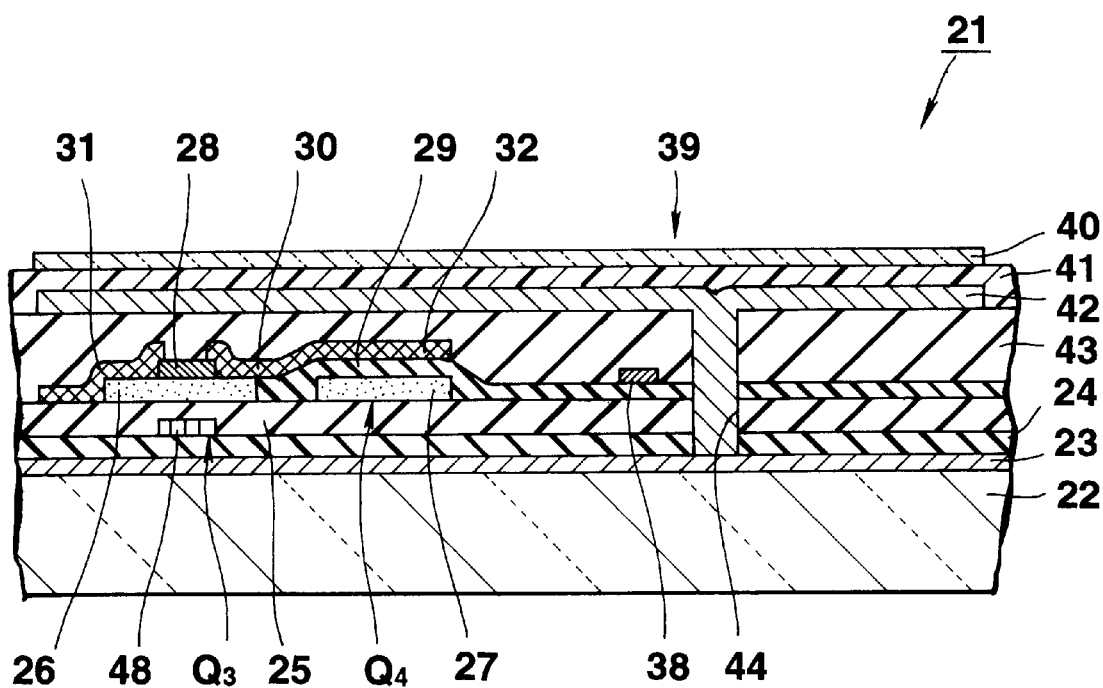
FIG. 18 is a cross section taken along the line 18—18 shown in FIG. 17.
Figure 19:
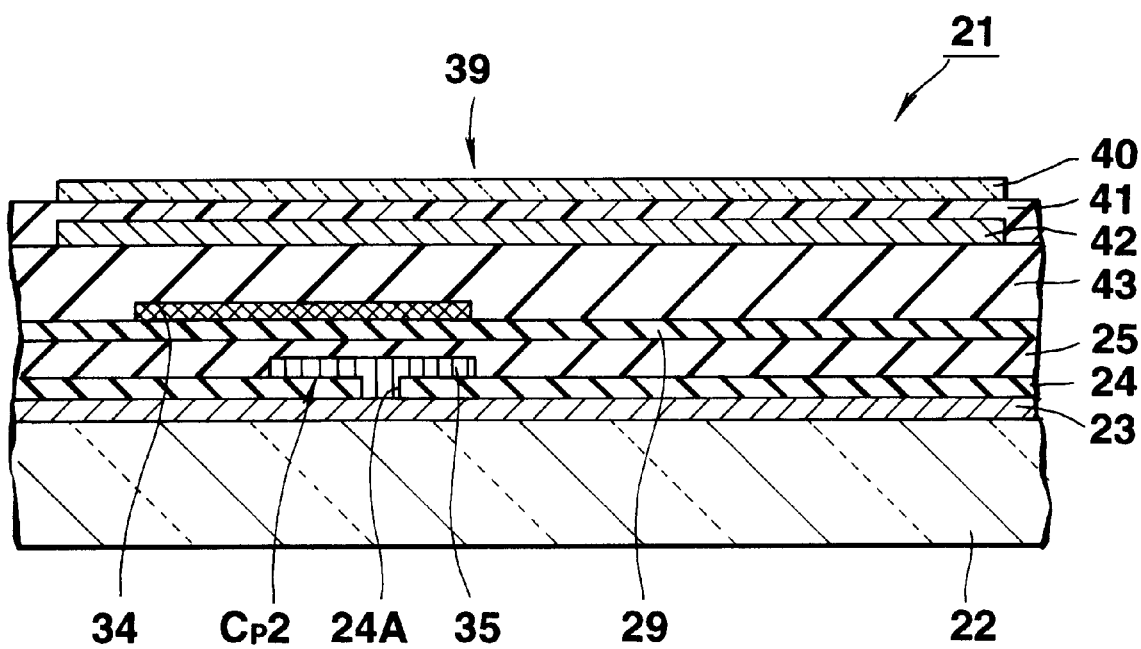
FIG. 19 is a cross section taken along the line 19—19 shown in FIG. 17.

The structure of a display apparatus according to another embodiment of the present invention will now be described with reference to FIGS. 17 to 20. FIG. 17 is a plan view of that part of the display apparatus of this embodiment which corresponds to one pixel. FIG. 18 is a cross section taken along the line 18—18 shown in FIG. 17. FIG. 19 is a cross section taken along the line 19—19 shown in FIG. 17.

Reference numeral 21 in the drawings denotes the display apparatus. In the display apparatus 21 of this embodiment, as shown in FIGS. 17 to 19, a grounded electrode 23 is formed on a substrate 22 over the entire display area. A base insulation film 24, which is made up of a silicon oxide film and/or the like, is patterned on the grounded electrode 23. Formed on the base insulation film 24 are parallel address lines 48, which are connected each to one of terminals X1 to Xm connected to a gate driver circuit (described later), and which are spaced at predetermined intervals. A first gate insulation film 25 is formed on the address lines 48 and the base insulation film 24. As show in FIGS. 17 and 18, a first semiconductor layer 26 and a second semiconductor layer 27, which are made of amorphous silicon and/or the like, are patterned on the first gate insulation film 25. The first semiconductor layer 26 enables the address lines 48 to function as gate electrodes. A blocking layer 28 is patterned on that part of the semiconductor layer 26 which is the middle portion of the layer 26 in a gate lengthwise direction (a vertical direction in FIG. 17). A second gate insulation film 29 is formed so as to cover the upper and side surfaces of the second semiconductor layer 27. The blocking layer 28 and the second gate insulation film 29 are made of silicon nitride and/or the like, and are formed by a CVD method. A source electrode 30 and a drain electrode 31 are formed on both sides of the first semiconductor layer 26 with respect to a gate widthwise direction so that the source and drain electrodes 30 and 31 are connected to the first semiconductor layer 26 (in FIG. 18, the source electrode 30 is formed on the right part of the first semiconductor layer 26, while the drain electrode 31 is formed on the left part of the first semiconductor layer 26). The address lines 48, the first gate insulation film 25, the first semiconductor layer 26, the source electrode 30 and the drain electrode 31 thus formed constitute a selection transistor Q3. The input impedance of the selection transistor Q3 is set at a large value. The drain electrode 31 shown in FIG. 17 is patterned and formed in integration with a corresponding one of data lines 47, which are connected each to one of terminals Y1 to Yn connected to a drain driver circuit (described later). The source electrode 31 shown in FIG. 17 is patterned and formed in integration with a gate electrode 32 which crosses over the middle part of the second semiconductor layer 27, with the second gate insulation film 29 being located between the second semiconductor layer 27 and the gate electrode 32. The source electrode 30 and the gate electrode 32 are patterned and formed in integration with a capacitor upper electrode 34 included in a capacitor Cp2. The capacitor Cp2 includes the capacitor upper electrode 34, the second gate insulation film 29 formed under the capacitor upper electrode 34, the first gate insulation film 25 and a capacitor lower electrode 35. The capacitor lower electrode 35 is connected to the grounded electrode 23 through a contact hole 24A formed in the base insulation film 24.

A source electrode 36 and a drain electrode 37 are formed on both sides of the gate electrode 32 of the second semiconductor layer 27. The second semiconductor layer 27, the second gate insulation film 29, the gate electrode 32, the source electrode 36 and the drain electrode 37 form a drive transistor Q4. The drain electrode 37 shown in FIG. 17 is formed in integration with a power source line 38 which is parallel with the data lines 47 and which applies a voltage for driving organic EL elements 39. The source electrode 36 is connected to an EL upper electrode 40 included in an organic EL element 39. In the display apparatus 21, the selection transistor Q3, the drive transistor Q4 and the capacitor Cp2 form a voltage controller.

As shown in FIGS. 17 and 19, each organic EL element 39 includes a light-shielding EL lower electrode 42 made of MgIn and/or the like and serving as a cathode electrode, an organic EL layer 41 formed on the EL lower electrode 42, and a transparent EL upper layer 40 made of ITO and/or the like and formed on the organic EL layer 41. The EL upper electrode 40 serves as an anode electrode.

The organic EL layer 41 includes an electron carrying layer, a luminous layer and a hole carrying layer. Of those layers included in the organic EL layer 41, the electron carrying layer is closest to the EL lower electrode 42, and the hole carrying layer is farthest from the EL lower electrode 42. The electron carrying layer is made of Alq3. The luminous layer is made of 96 wt % DPVBi and 4 wt % BCzVBi. The hole carrying layer is made of N,N'-di(α-naphthyl)-N,N'-diphenyl-1,1'-biphenyl-4,4'-diamine (referred to as α-NPD).

The organic EL element 39 is formed on an interlayer insulation film 43 which covers the selection transistor Q3 and the drive transistor Q4 and which is formed over the entire display area. The EL lower electrode 42 is connected to the grounded electrode 23 through a contact hole 44 formed in the first gate insulation film 25 and the base insulation film 24. Of the area surrounded by a two-dot chain line in FIG. 17, the part except a projecting portion 40A is covered by the EL lower electrode 42. The EL lower electrode 42, which is a rectangular electrode covering the selection transistor Q3, the drive transistor Q4 and the capacitor Cp2, etc., occupy the most part of the area occupied by one pixel. The organic EL layer 41 is a layer extending over the entire display area. The EL upper electrode 40 extends over the area surrounded by the two-dot chain line in FIG. 17. The projecting portion 40A of the EL upper electrode 40 is connected to the source electrode 36 of the drive transistor Q4 through a contact hole 45, as shown in FIG. 17. The power source line 38 is connected to the driving power source Ps which continually applies the constant voltage Vdd.

Figure 20:
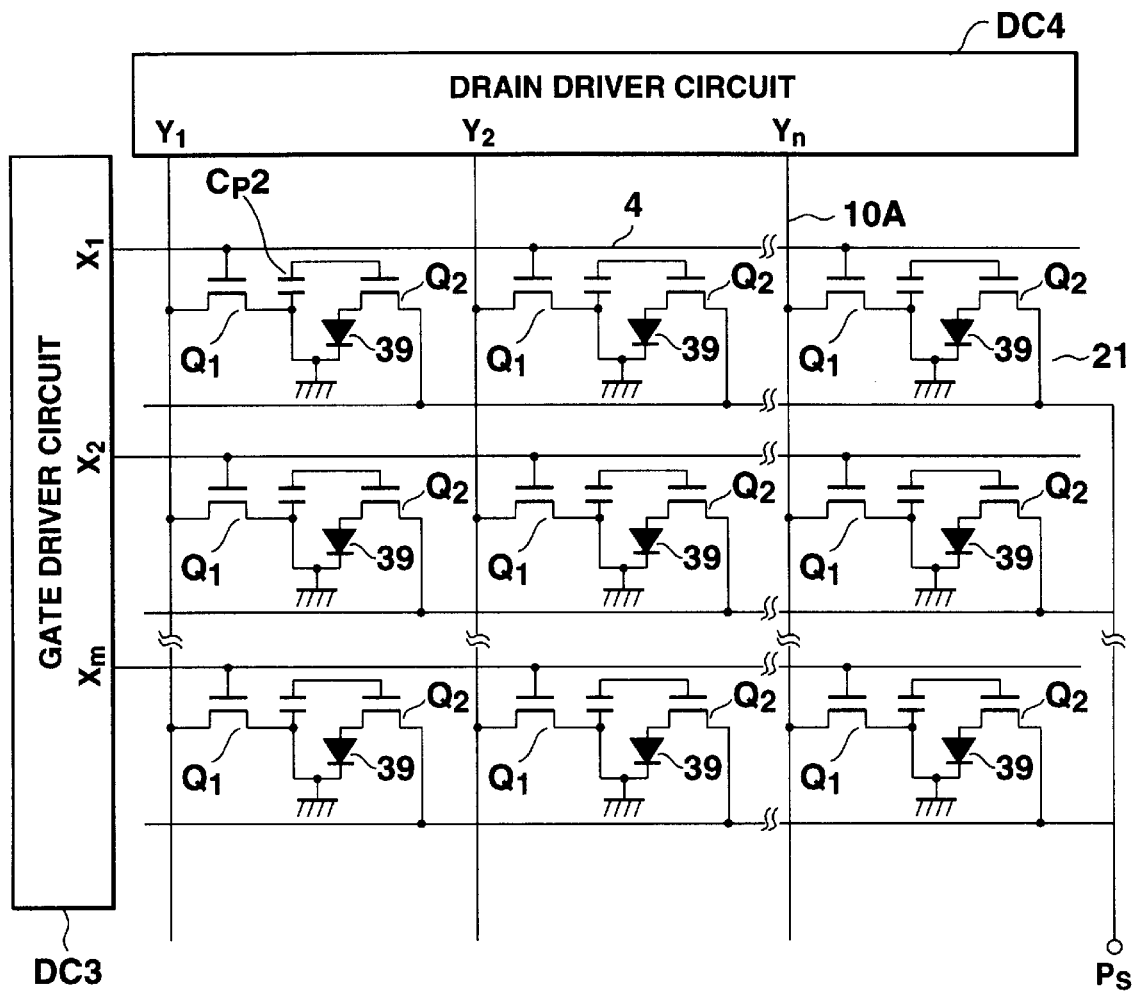
FIG. 20 is a diagram showing driver circuits used in the display apparatus illustrated in FIG. 17.

FIG. 20 is a diagram showing driver circuits included in the display apparatus 21 illustrated in FIG. 17.

A drive method for having the display apparatus 21 of this embodiment emit light will now be described.

A gate driver circuit DC3 is driven to output a selection signal to any one of the address lines 48. In synchronization with the output of the selection signal to one address line 48, a drain driver circuit DC4 is driven to output a data signal to the data lines 47. When the number of address lines 48 is N, 1 scanning period during 1 frame period T is T/N, and the selection signal has such a voltage value as to enable the writing voltage Vr exceeding the gate threshold value Vth of selection transistors Q3 to be applied to the address line 48 during 1 scanning period. Upon the application of the selection signal, selection transistors Q3 in FIG. 20 are turned on, and a voltage according to the data signal output to the data lines 47 is applied to the gate electrodes 32 of drive transistors Q4, and is stored in capacitors Cp2. The capacitors Cp2 retain the voltage according to the data signal over 1 frame period, and the value of the resistance in the drive transistors Q4 is controlled to a substantially constant value until the next selection period by the potential Vc retained in the capacitors Cp. In accordance with the value of the resistance in the drive transistors Q4, the potential Vdd is applied through the power source line 38 to the organic EL layer 41. As a result, a substantially constant current flows through the organic EL layer 41, and the organic EL layer 41 emits light at a substantially constant luminance during 1 frame period. By repeating those operations, the display apparatus 21 can maintain the state of emitting light, and accordingly the contrast in an image displayed on the display apparatus 21 is remarkably improved over the conventional passive matrix type EL display apparatus. Since a current supplied to the organic EL layer 41 can be precisely controlled through the use of the transistors Q3 and Q4, the display apparatus 21 can perform gray-scale display with ease. If wavelength conversion layers and/or color filter layers are used as shown in FIGS. 10 to 15, the display apparatus 21 can perform full-color (multicolor) display as well.

In the display apparatus 21 of this embodiment, the area occupied by each EL lower electrode 42 is not limited by the thin film transistors Q3 and Q4. Therefore, the ratio of the light emitting area to each pixel area can be enhanced, with the result that the organic EL elements 39 can emit light at the desired luminance without the application of an excessively high voltage.

Since the EL lower electrodes 42 are made of a light-shielding material, the light emitted by the organic EL layer 41 does not enter the selection transistors Q3 or drive transistors Q4 located below the EL lower electrodes 42. Accordingly, the transistors Q3 and Q4 are prevented From malfunctioning due to such light, and the display apparatus 21 of this embodiment can be reliably driven.

The area of the interface between the organic EL layer 41 and the EL lower electrodes 42 is large. This permits the organic EL layer 41 and the EL lower electrodes 42 to be joined together in a preferred condition, and ensures to the display apparatus 21 of this embodiment a luminous life improved over that of the conventional active matrix type EL display apparatus. The EL lower electrodes 42 are formed on a flat layer having no steps, and therefore are free from the possibility of the EL lower electrodes 42 breaking at steps.

The grounded electrode 23 formed over the entire display area is made of a light-shielding metal such as Al, and therefore can shield the light coming from the substrate 22 and can make the light enter the transistors Q3 and Q4.

In the embodiments described above, polycrystalline silicon can be used in place of amorphous silicon in order to form the semiconductor layers of the transistors. However, amorphous silicon elements are preferable to polycrystalline silicon elements.

In the above-described embodiments, impurity-doped silicon nitride films, which has a capability to catch carriers and store a gate voltage, can be employed as the gate insulation films of the drive transistors. By thus conferring the voltage storing capability on the drive transistors themselves in addition to the use of the capacitors, the voltage storing capability of the entire circuitry is improved.

In the above embodiments, the transistors are MOS transistors. However, they may be bipolar transistors. Due to the input impedance of each of the selection transistors being set at a large value, the selection transistors have the effect of suppressing the amount of current flowing through the address lines to a great extent when a selection signal voltages is applied to the bases, even in the case where the number of selection transistors connected to each selection signal line is large. Accordingly, the amount of current which the organic EL elements require can be made small, and the life of the power source can be enhanced. Similarly in the case where a data signal voltage is applied to the drive transistors, the attenuation of the voltage stored in the capacitors can be suppressed to a great extent so as to prolong the period of time over which the data signal voltage is retained, due to the input impedance of those transistors being set at a large value.

Figure 21:
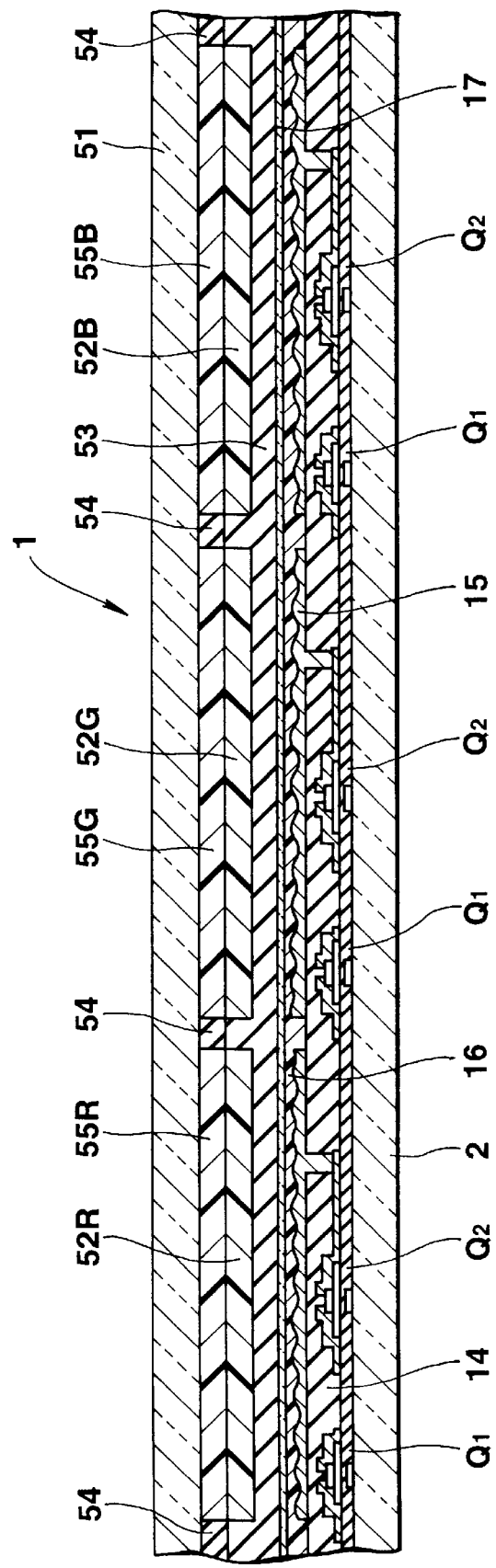
FIG. 21 is a sectional view of a display apparatus including a cathode electrode having a rough surface.
Figure 22:
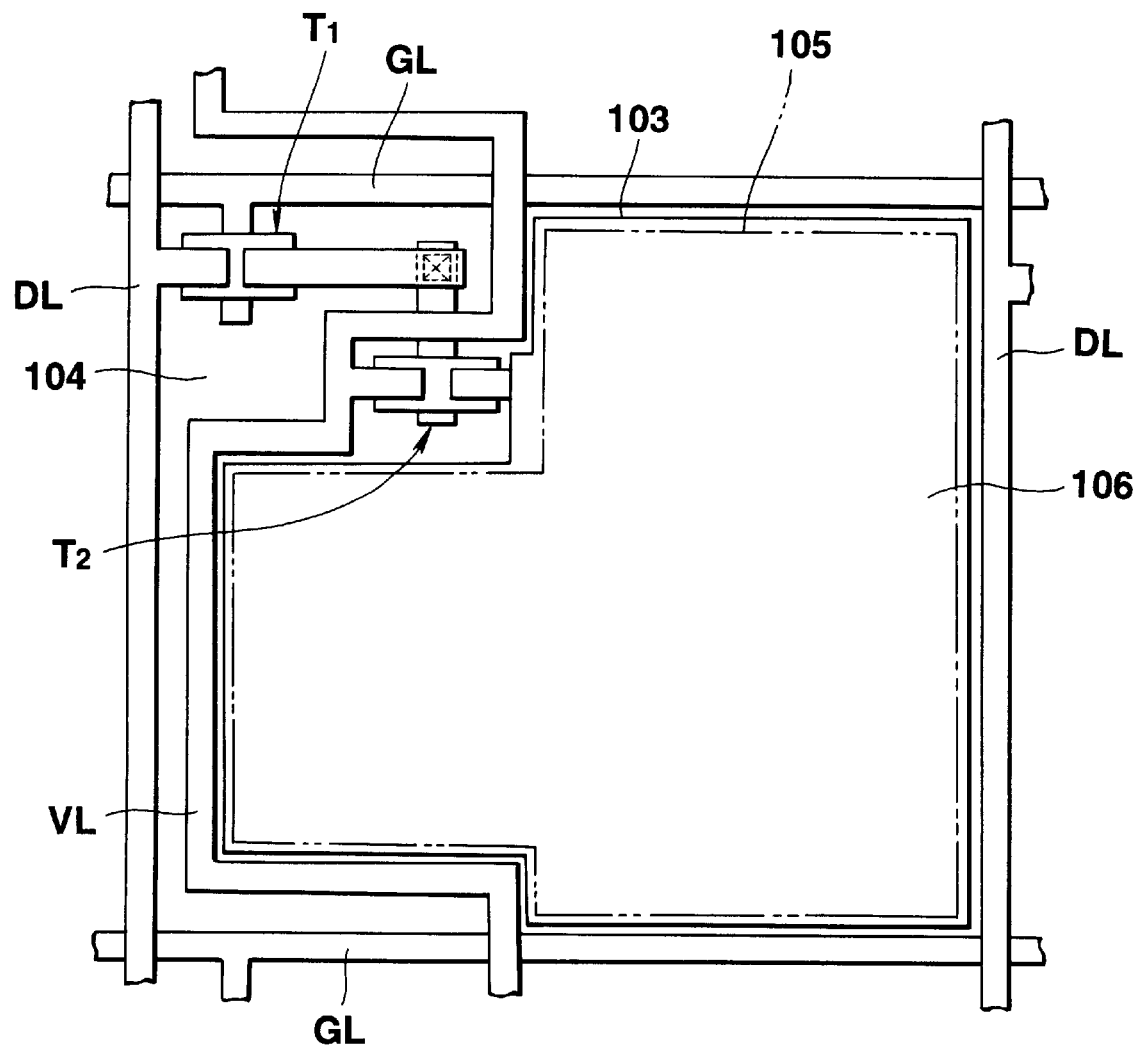
FIG. 22 is a plan view of a display apparatus according to the related art.
Figure 23:
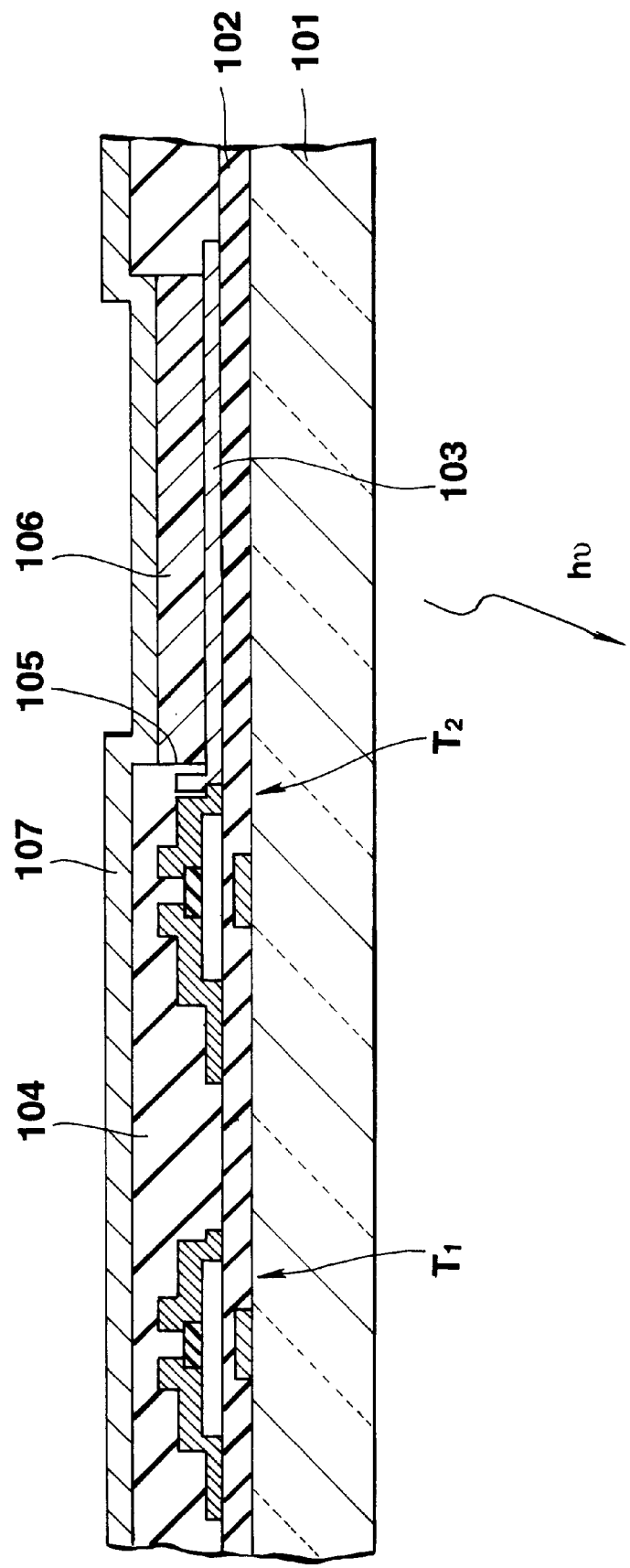
FIG. 23 is a sectional view of the display apparatus illustrated in FIG. 21.

The present invention is not limited to the above embodiments, and various changes can be made without departing from the scope of the present invention. For example, the cathode electrodes are made of MgIn in the above embodiments. However, a visible-light shielding material having a low work function and containing Mg and/or the like can also be used. It is also possible to form the cathode electrodes 15 so as to have rough surfaces and to form the organic EL layer 16 on those rough surfaces, as shown in FIG. 21. The cathode electrodes 15 having such rough surfaces can be formed using an Mg material doped with Ag. In this case, not only flicker due to the reflection of the external light at the cathode electrodes 15 is suppressed, but also the area of the interface between the organic EL layer 16 and the cathode electrodes 15 is increased such that successful joining is attained between the organic EL layer 16 and the cathode electrodes 15, ensuring a long luminous life to the organic EL elements 3. The display apparatuses according to the above embodiments display images through utilization of the light emitted by the organic EL elements 3 only. However, the display apparatuses may include liquid crystal display panels as shutters.

In the above-described embodiments, the driving power source Ps continually applies a constant voltage to the organic EL elements. However, since the luminance of the organic EL elements is determined by the amount of recombination of electrons and holes, that is, the amount of current, the structure wherein the driving power source Ps applies a constant voltage is particularly advantageous when the areas occupied by the pixels are substantially equal to each other as in the case of matrix panels according to the above embodiments.

What is claimed is:

1. A display apparatus comprising:
    a substrate;
    active elements formed over said substrate and driven by an externally supplied signal;
    an insulation film formed over said substrate so as to cover said active elements, said insulation having at least one contact hole;
    at least one first electrode formed on said insulation film so as to cover said active elements, and connected to said active elements through said at least one contact hole, said at least one first electrode being made of a material which shields visible light;
    an organic electroluminescent layer having an organic electroluminescent material formed on said at least one first electrode so as to cover said active elements and including at least one layer which emits light in accordance with a voltage applied to said at least one layer; and
    at least one second electrode formed on said organic electroluminescent layer which covers said active elements.

2. The display apparatus according to claim 1, wherein said at least one first electrode is formed of a conductive material containing magnesium.

3. The display apparatus according to claim 1, wherein said at least one first electrode has a rough surface which is in contact with said organic electroluminescent layer.

4. The display apparatus according to claim 1, wherein said active elements are a selection transistor which is turned on in response to an externally supplied address signal and a drive transistor, which is driven by a signal corresponding to image data supplied externally through said selection transistor while said selection transistor is on, for controlling a voltage to be applied to said organic electroluminescent layer, said selection transistor and said drive transistor forming a pair.

5. The display apparatus according to claim 4, wherein said at least one first electrode is connected to said drive transistor through said at least one contact hole.

6. The display apparatus according to claim 4, wherein:
    said display apparatus further comprises a capacitor for retaining the signal corresponding to the image data externally supplied through said selection transistor while said selection transistor is on; and
    while said selection transistor is off, said drive transistor is driven by the signal retained in said capacitor.

7. The display apparatus according to claim 1, wherein:
    said active elements are transistors forming pairs and arranged in a matrix pattern, one transistor of each of said pairs being a selection transistor which is turned on in response to an externally supplied address signal, and the other transistor of each of said pairs being a drive transistor, which is driven by a signal corresponding to image data supplied externally through said selection transistor while said selection transistor is on, for controlling a voltage to be applied to said organic electroluminescent layer;
    said selection transistor of each of said pairs is connected to one of address lines and one of data lines, said address lines being formed over said substrate and being supplied with said address signal, and one of said data lines being formed over said substrate and being supplied with said image data; and
    said at least one first electrode is plural in number, and the plurality of first electrodes are arranged in a matrix pattern in areas surrounded by said address lines and said data lines.

8. The display apparatus according to claim 1, wherein a constant voltage is applied to said second electrode.

9. The display apparatus according to claim 1, further comprising at least one wavelength conversion layer formed over said at least one second electrode, said at least one wavelength conversion layer emitting light in a first wavelength range by absorbing light in a second wavelength range emitted from said organic electroluminescent layer.

10. The display apparatus according to claim 9, wherein said at least one wavelength conversion layer has a concave surface facing said at least one second electrode.

11. The display apparatus according to claim 9, wherein said at least one wavelength conversion layer has at least two of a red conversion layer which emits light in a red wavelength range, a green conversion layer which emits light in a green wavelength range, and a blue conversion layer which emits blue light.

12. The display apparatus according to claim 1, wherein:

said display apparatus further comprises at least one filter formed above said at least one second electrode; and light lays in a first wavelength range pass through said at least one filter selectively when incident light rays in a second wavelength range including said first wavelength range enter said at least one filter.

13. The display apparatus according to claim 12, wherein said at least one filter has a red filter which makes light in a red wavelength range pass through, a green filter which makes light in a green wavelength range pass through, and a blue filter which makes light in a blue wavelength range pass through.

14. The display apparatus according to claim 1, wherein said organic electroluminescent layer has a thickness whose value falls in a range of wavelength of light which said organic electroluminescent layer emits.

15. A display apparatus comprising:

a substrate;

selection transistors formed over said substrate and arranged in a matrix pattern;

drive transistors formed over said substrate and arranged in a matrix pattern, each of said drive transistors being connected to one of said selection transistors;

address lines connected to said selection transistors and through which a signal for turning on said selection transistors is supplied;

data lines connected to said selection transistors, a signal which corresponds to image data being supplied to said drive transistors through said data lines and said selection transistors while said selection transistors are on;

an insulation film formed over said substrate so as to cover said drive transistors, said address lines and said data lines, said insulation film having contact holes formed in correspondence with said drive transistors;

first electrodes made of a material which shields visible light, and formed on said insulation film so as to cover said selection transistors and said drive transistors, said first electrodes being arranged in a matrix pattern in areas surrounded by said address lines and said data lines, and being connected to said drive transistors through said contact holes;

an organic electroluminescent layer formed on said first electrodes which covers said selection transistors and said drive transistors and including at least one layer which emits light in accordance with an applied voltage;

a second electrode formed on said organic electroluminescent layer which covers said selection transistors and said drive transistors;

a first driver circuit for selectively supplying said address signal to said address lines in sequence; and a second driver circuit for supplying said image data to said data lines.

16. The display apparatus according to claim 15, wherein a constant voltage is applied to said second electrode.

17. The display apparatus according to claim 1, wherein said display apparatus further comprises at least one filter, formed above said at least one second electrode, which selectively permits light rays in a first wavelength range to pass therethrough when incident light rays in a second wavelength range including said first wavelength range enter said at least one filter.

18. The display apparatus according to claim 17, wherein said at least one filter has a red filter which permits light in a red wavelength range to pass therethrough, a green filter which permits light in a green wavelength range to pass therethrough, and a blue filter which permits light in a blue wavelength range to pass therethrough.

* * * * *